United States Patent [19]
Hase et al.

[11] Patent Number: 5,937,020
[45] Date of Patent: Aug. 10, 1999

[54] DIGITAL INFORMATION SIGNAL REPRODUCING CIRCUIT AND DIGITAL INFORMATION SYSTEM

[75] Inventors: Kenichi Hase; Ryutaro Horita, both of Yokohama; Tsuguyoshi Hirooka, Fujisawa; Haruto Katsu, Yokohama; Takashi Nara, Takasaki; Shoichi Miyazawa, deceased, late of Yokohama, by Yukie Miyazawa, heiress; Shintaro Suzumura, Yokohama, all of Japan

[73] Assignee: Hitachi, Ltd., Tokyo, Japan

[21] Appl. No.: 08/719,875

[22] Filed: Sep. 25, 1996

[30] Foreign Application Priority Data

Sep. 26, 1995 [JP] Japan ................................ 7-247734
May 10, 1996 [JP] Japan ................................ 8-115892

[51] Int. Cl.⁶ .............................. H03D 3/24; H03D 3/02; H03L 7/00
[52] U.S. Cl. ...................... 375/376; 375/373; 327/141; 329/325
[58] Field of Search ................................ 375/376, 327, 375/375, 373, 374; 331/25, 10, 55; 348/537, 524, 542; 327/141, 146, 147, 148, 155–157; 360/41, 51; 329/325

[56] References Cited

U.S. PATENT DOCUMENTS 4,802,009  1/1989  Hartmeier ............................ 358/158
5,075,640  12/1991 Miyazawa ............................ 331/10
5,228,035  7/1993  Hirato et al. ........................ 370/446
5,552,942  9/1996  Ziperovich et al. ................. 360/51
5,583,706  12/1996 Dudley et al. ...................... 360/46
5,648,964  7/1997  Inagaki et al. ..................... 370/228
5,675,620  10/1997 Chen .................................. 375/376

OTHER PUBLICATIONS

"Timing Recovery in Digital Synchronous Data Receivers", IEEE Transactions on Communications, vol. COM–24, No. 5, May 1976, pp. 516–531.

*Primary Examiner*—Chi H. Pham
*Assistant Examiner*—Khai Tran
*Attorney, Agent, or Firm*—Antonelli, Terry, Stout & Kraus, LLP

[57] ABSTRACT

Digital information including a sync data field and a user data field subsequent thereto is read from a storage media as a digital information signal in an analog signal format. The obtained signal is sampled according to a clock signal and is thereby transformed into a digital information signal in a digital format. In the sync data field, the clock signal is synchronized with the digital information signal by an analog PLL circuit. Thereafter, in the user data field, the clock signal is synchronized with the digital information signal by a digital PLL circuit.

42 Claims, 18 Drawing Sheets

$F(s) = \Delta V / Ir1$
$= R$ $F(s) = k \cdot R + 1 / (C \cdot s)$ $k = Ir2 / Ic$

5,937,020

DIGITAL INFORMATION SIGNAL REPRODUCING CIRCUIT AND DIGITAL INFORMATION SYSTEM

BACKGROUND OF THE INVENTION

The present invention relates to a digital information storage apparatuses such as a magnetic disk driver, an optical disk driving device, and a magnetic tape unit as well as digital information systems including a digital communication apparatus operating, for example, in the asynchronous transfer mode (ATM), and in particular, to a digital information signal data reproducing circuit including a clock control circuit supervising the frequency and phase of clock pulses which determines timing of the sampling of reproduction signals in the digital information system of the above type and to a digital information system employing the digital information signal data reproducing circuit.

Signals read from a storage media in the digital storage apparatuses described above and reception signals received via a transmission route in the digital communication system are generally in an analog form. Consequently, it is necessary to sample the signals in the analog form according to a timing clock signal extracted by timing extraction means so as to transform the analog signals into signals in a digital form. For example, there has been known a representative method of this signal processing, namely, a partial response maximum likelihood (PRML) method for use with a magnetic disk drive. In this method, according to a partial response (PR) signal read from a recording media, there is created a timing clock signal by timing extraction means including a phase locked loop (PLL) circuit such that the partial response signal is sampled to convert the analog signal into a digital signal according to the maximum likelyhood method.

FIG. 23 shows a conventional PRML signal processing circuit employed to reproduce signals in a magnetic disk unit. In operation, a differential reproduction signal read from a magnetic disk 1001 as the recording media and reproduced by a magnetic head 1002 is then amplified by an amplifier 1003, and then a high-frequency component as a noise is removed from the amplified signal by a active filter (AF) 1004. The resultant signal is sampled by an analog-to-digital converter (ADC) 1005 according to timing of a clock signal generated from a clock control circuit 1080 to be transformed into a digital signal. The signal from the converter 1005 is equalized with respect to the waveform by a digital equalizer (DEQ) 1006 and then is decoded by a viterbi decoder 1007 through a maximum likelihood process according to the viterbi decoding algorithm.

In the clock controller 1080, the signals from the digital equalizer 1006 are processed such that a gradient of amplitude values (including the sign) of the signals at two adjacent points is detected as a phase error. According to the phase error, an appropriate current is supplied from a digital-to-analog converter (DAC) 1009 such that the high-frequency component is removed from the signal by a loop filter 1010 to be transformed into a voltage signal. In response to the output voltage from the loop filter 1010, the frequency of a voltage controlled oscillator (VCO) 1011 is controlled to resultantly generate the clock signal. Details about the digital phase comparator have been described in pages 516 to 531 of an article "Timing Recovery in Digital Synchronous Data Receivers", IEEE Transactions On Communications, Vol. COM-24, No. 5 published in May 1976.

The clock controller 1080 includes a digital control loop including the ADC 1005, digital equalizer 1006, digital phase comparator 1008, DAC 1009, loop filter 1010, and VOC 1011 and hence is called a digital phase locked loop (PLL).

FIG. 24 shows a data format used in the magnetic disk unit. Each data includes a synchronizing (sync) data item 1100 including a fixed pattern such as [1,1,−1,−1] and a user data item 1200. According to the reproducing method, while the sync data 1100 is being reproduced, the frequency and phase of the clock control circuit 1080 are adjusted by itself to those of the reproduced signal. When the clock adjustment or capturing is completely finished, the user data 1200 is reproduced. Since the sync data 1100 including about 20 bytes to about 30 bytes is written on the recording media 1001 on which the user data 1200 is also recorded, i.e., the user data recording capacity is also consumed by the sync data 1100.

In the clock control circuit 1080 of FIG. 23 using the conventional digital PLL, when the characteristic frequency (to be referred to as a gain herebelow) is set to a higher value to increase the adjustment of the frequency and phase in which the frequency and phase of the clock signal are to be captured as above, the phase margin is reduced due to a long loop delay of the feed-back control, which possibly leads to a problem of insufficient stability of the system. The gain determines the frequency capture range and time and hence is one of the essential setting parameters associated with the performance of the clock control circuit 1080.

For example, in a case of a digital PLL having a loop delay of 20 clocks, even when the gain is increased to its maximum value, at least 20 bytes are required for the sync data 1100 to capture the frequency deviation of about 0.5%. In other words, the conventional digital data reproducing circuit using the digital PLL is accompanied by drawbacks of a narrow frequency capture range and a long sync capture time. This additionally results in a disadvantage that the sync data is also increased and hence the user data record capacity is accordingly minimized. It has been required in the markets that a frequency deviation of about 3% is captured with a sync data length of 12 bytes or less. This requirement consequently cannot be fully satisfied by the conventional control method using the digital PLL.

SUMMARY OF THE INVENTION

It is therefore an object of the present invention to provide a digital information signal reproducing circuit including a clock control circuit having a wide frequency capture range and a short frequency capture time and a digital information system using the digital information signal reproducing circuit including a clock control circuit.

Another object of the present invention to minimize the required data length of the sync data so as to increase the user data storage capacity.

In order to achieve the above objects according to the present invention, there is provided a digital information signal reproducing circuit including a clock control circuit including a phase locked loop (PLL) circuit in which a digital information signal received in an analog signal format is sampled according to a clock signal produced from the clock control circuit and is then transformed into a digital information signal of a digital signal format. The clock control circuit includes an analog PLL circuit and a digital PLL circuit.

Additionally, according to an aspect of the present invention, there is provided a digital information signal reproducing circuit including a clock control circuit including a PLL circuit in which a digital information signal received in an analog signal format is sampled according to a clock signal produced from the clock control circuit and is then transformed into a digital information signal of a digital signal format. The clock control circuit includes an analog PLL circuit and a digital PLL circuit, and the analog and digital PLL circuits share a synchronizing clock generating circuit.

Moreover, according to another aspect of the present invention, there is provided a digital information signal reproducing circuit including a clock control circuit including a PLL circuit in which a digital information signal received in an analog signal format is sampled according to a clock signal produced from the clock control circuit and is then transformed into a digital information signal of a digital signal format. The clock control circuit includes an analog PLL circuit and a digital PLL circuit, and the digital information signal reproducing circuit further includes a control circuit for changing over control from the analog PLL circuit to the digital PLL circuit, and vice versa.

In addition, according to further another aspect of the present invention, there is provided a digital information signal reproducing circuit including a clock control circuit including a PLL circuit in which a digital information signal received in an analog signal format is sampled according to a clock signal produced from the clock control circuit and is then transformed into a digital information signal of a digital signal format. The clock control circuit includes an analog PLL circuit and a digital PLL circuit, and the digital information signal reproducing circuit further includes a control circuit for changing over control from the analog PLL circuit to the digital PLL circuit, and vice versa. The control circuit first activates, in a digital signal reproduction, the analog PLL circuit and thereafter activates the digital PLL circuit.

Furthermore, according to still another aspect of the present invention, there is provided a digital information system comprising a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format. Each data of the digital information signal from the digital information signal source has a data format including sync data and user data subsequent thereto, and the clock control circuit includes an analog PLL circuit and a digital PLL circuit.

Additionally, according to another aspect of the present invention, there is provided a digital information system comprising a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format. Each data of the digital information signal from the digital information signal source has a data format including sync data and user data subsequent thereto, the clock control circuit includes an analog PLL circuit and a digital PLL circuit, the analog PLL circuit operates when the sync data is reproduced, and the digital PLL circuit operates when the user data is reproduced.

Moreover, according to another aspect of the present invention, there is provided a digital information system comprising a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format. Each data of the digital information signal from the digital information signal source has a data format including sync data and user data subsequent thereto, and the clock control circuit includes an analog PLL circuit and a digital PLL circuit. The analog PLL circuit operates when the sync data is reproduced, the circuit capturing a frequency. The digital PLL circuit operates when the user data is reproduced, the circuit capturing and following a frequency and a phase.

In addition, according to another aspect of the present invention, there is provided a digital information storage comprising a digital information signal reproducing circuit including a storage media for storing thereon a digital information signal, a read circuit for reading in an analog signal format the digital information signal from the storage media, and a clock control circuit including a PLL circuit in which a digital information signal received from the read circuit in an analog signal format is sampled according to a clock signal produced from the clock control circuit and is then transformed into a digital information signal of a digital signal format. Each data of the digital information signal stored on the storage media has a data format including sync data and user data subsequent thereto, the clock control circuit includes an analog PLL circuit and a digital PLL circuit, the analog PLL circuit operates when the sync data is reproduced, and the digital PLL circuit operates when the user data is reproduced.

Moreover, according to another aspect of the present invention, there is provided a digital information storage comprising a digital information signal reproducing circuit including a storage media for storing thereon a digital information signal, a read circuit for reading in an analog signal format the digital information signal from the storage media, and a clock control circuit including a PLL circuit in which a digital information signal received from the read circuit in an analog signal format is sampled according to a clock signal produced from the clock control circuit and is then transformed into a digital information signal of a digital signal format. Each data of the digital information signal stored on the storage media has a data format including sync data and user data subsequent thereto and the clock control circuit includes an analog PLL circuit and a digital PLL circuit. The analog PLL circuit operates when the sync data is reproduced, the circuit capturing a frequency. The digital PLL circuit operates when the user data is reproduced, the circuit capturing and following a frequency and a phase.

Moreover, according to another aspect of the present invention, there is provided a digital information storage comprising a digital information signal reproducing circuit including a storage media for storing thereon a digital information signal, a read circuit for reading in an analog signal format the digital information signal from the storage media, and a clock control circuit including a PLL circuit in which a digital information signal received from the read circuit in an analog signal format is sampled according to a clock signal produced from the clock control circuit and is then transformed into a digital information signal of a digital signal format. Each data of the digital information signal stored on the storage media has a data format including sync data and user data subsequent thereto, the clock control circuit includes an analog PLL circuit and a digital PLL circuit, the analog PLL circuit operates when the sync data is reproduced, the digital PLL circuit operates when the user data is reproduced, and the sync data includes at most 12 bytes.

Moreover, according to another aspect of the present invention, there is provided a digital information signal reproducing circuit comprising an analog-to-digital converter for converting a digital information signal in a differential analog format into a digital information signal in a digital signal format, an equalizer for achieving a waveform equalization, and a clock control circuit for controlling a frequency and a phase of a clock signal to match a frequency and a phase of the digital information signal in the differential analog format. The clock control circuit includes first detecting means for detecting a phase error between the digital information signal in the differential analog format before a sampling operation thereof and the clock signal, second detecting means for detecting a phase error between a reproduction signal attained by achieving a waveform equalization (for the digital information signal) through the equalizer and the clock signal, a loop filter for removing a high-frequency component from a signal inputted thereto, a voltage controlled oscillator having a clock signal oscillation frequency controlled by a signal outputted from the loop filter, and a sequencer for controlling operations of the first and second detecting means.

Furthermore, according to another aspect of the present invention, the first detecting means includes a cross sensor for outputting therefrom a pulse signal at timing of intersection of the digital information signal in the differential analog format before the sampling thereof, a divider for dividing the clock signal outputted from the voltage controlled oscillator, a phase comparator for detecting a phase error between the signal outputted from the divider and the pulse signal outputted from the cross sensor, and a current outputting circuit for supplying a current corresponding to the signal outputted from the phase comparator.

Additionally, according to another aspect of the present invention, the second detecting means includes a phase comparator for detecting as a phase error a gradient of amplitude values at two adjacent points of the reproduction signal undergone the sampling operation and the waveform equalization and a digital-to-analog converter for converting the gradient detected as the phase error by the phase comparator into an amount of current corresponding to the gradient.

Furthermore, according to another aspect of the present invention, the clock signal inputted to the first detecting means and the clock signal inputted to the second detecting means, the analog-to-digital converter, and the equalizer have a phase discrepancy of π therebetween.

Moreover, according to another aspect of the present invention, there is provided a digital information system comprising a digital information signal reproducing circuit including a digital information signal source for supplying a digital information signal in an analog signal format and a clock control circuit including a PLL circuit in which a digital information signal received from the digital information signal source in a differential analog signal format is sampled according to a clock signal produced from the clock control circuit and is then transformed into a digital information signal of a digital signal format. Each data of the digital information signal from the digital information signal source has a data format including sync data and user data subsequent thereto. The clock control circuit including first detecting means for detecting a phase error between the digital information signal in the differential analog format before a sampling operation thereof and the clock signal, second detecting means for detecting a phase error between a reproduction signal attained by achieving a waveform equalization (for the digital information signal) through an equalizer and the clock signal, a loop filter for removing a high-frequency component from a signal inputted thereto, a voltage controlled oscillator having a clock signal oscillation frequency controlled by a signal outputted from a loop filter, and a sequencer for controlling operations of the first and second detecting means.

In addition, according to another aspect of the present invention, there is provided a digital information storage comprising a digital information signal reproducing circuit including a storage media for storing thereon a digital information signal, a read circuit for reading in a differential analog signal format the digital information signal from the storage media, and a clock control circuit including a PLL circuit in which a digital information signal received from the read circuit in an analog signal format is sampled according to a clock signal produced from the clock control circuit and is then transformed into a digital information signal of a digital signal format. Each data of the digital information signal stored on the storage media has a data format including sync data and user data subsequent thereto. The clock control circuit including first detecting means for detecting a phase error between the digital information signal in the differential analog format before a sampling operation thereof and the clock signal, second detecting means for detecting a phase error between a reproduction signal attained by achieving a waveform equalization (for the digital information signal) through an equalizer and the clock signal, a loop filter for removing a high-frequency component from a signal inputted thereto, a voltage controlled oscillator having a clock signal oscillation frequency controlled by a signal outputted from a loop filter, and a sequencer for controlling operations of the first and second detecting means.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
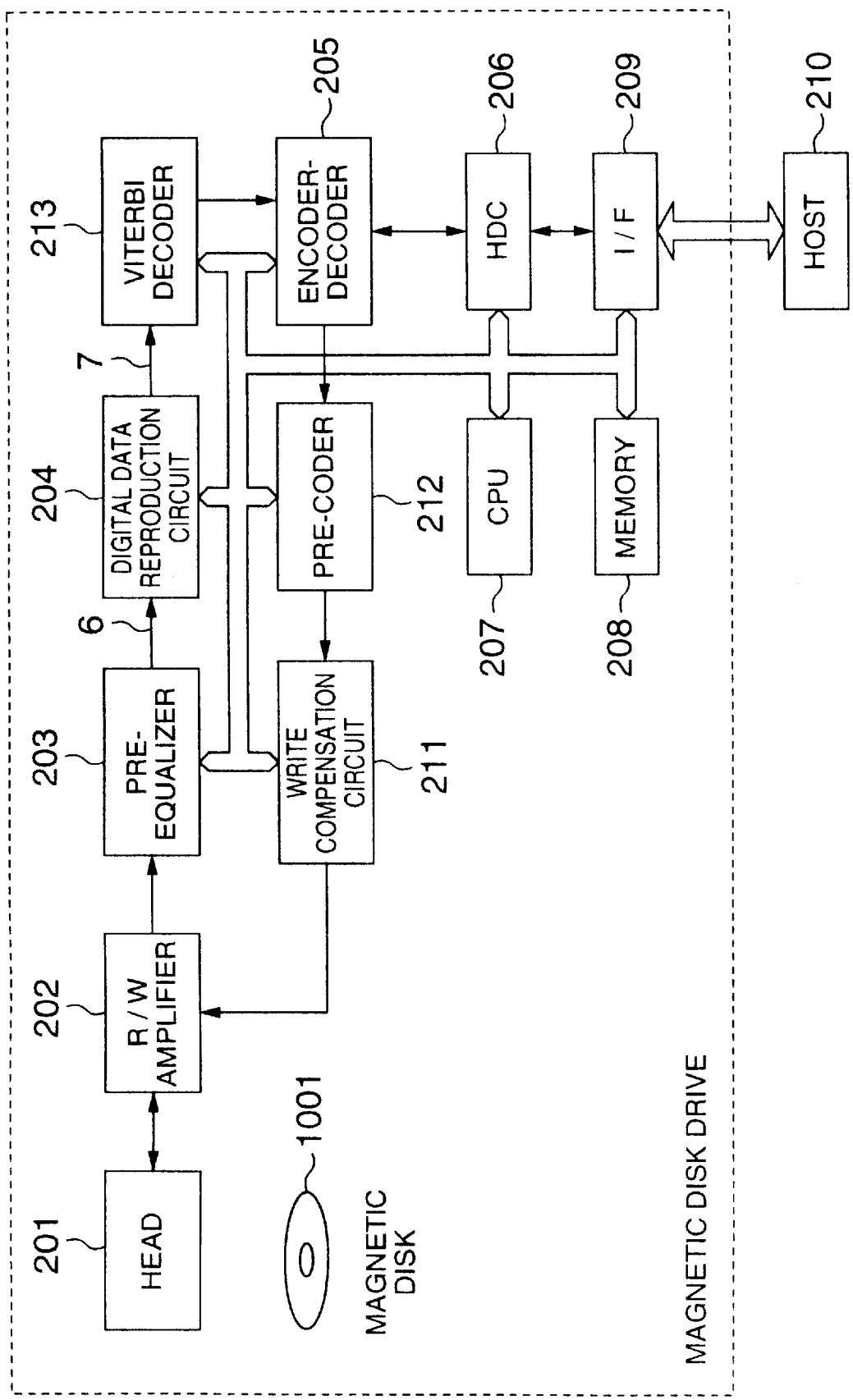
FIG. 1 is a diagram showing an example of the digital information system to which the present invention is applied.

Referring now to the accompanying drawings, description will be given of embodiments according to the present invention.

First, referring to FIG. 1, description will be given of an example of the information processing system including a storage in which the digital information signal reproducing circuit of the present invention is adopted. That is, the present invention is applied to a magnetic disk drive in this system. The drive unit includes a read/write (R/W) head 201 for conducting signal reading and writing operations on a magnetic disk 1001, a read/write (R/W) amplifier 202 for amplifying signals, a pre-equalizer 203 for removing noises from the signals and shaping the waveform thereof, and a digital information signal reproducing circuit 204 according to the present invention. The magnetic disk unit further includes a maximum likelihood decoder circuit 213 to decode data 7 produced from the signal reproducing circuit 204 into maximum likelihood data, an encoder-decoder for encoding data into a recording code and decoding the encoded data into nonreturn-to-zero (NRZ) data, a pre-coder 212 for achieving a pre-coding operation for the write data, a write compensation circuit 211 for conducting write compensation for the write data, a hard disk controller (HDC) 206 for controlling data, an interface (I/F) 209 for achieving a data interface operation, a central processing unit (CPU) 207 for controlling the hard disk controller 206, the interface 209, and the like, and a memory 208 for storing therein data and the contents of processing. The magnetic disk drive is linked via the interface 209 to a host computer 210 accomplishing data processing.

In the disk drive, the stored data is processed to be converted into a digital information signal as follows. First, an analog signal read by the head 201 from the magnetic disk 1001 is amplified by the amplifier 202 to be sent to the pre-equalizer 203. Noise components are removed from the signal and then the waveform of the signal is shaped by the pre-equalizer 203. The obtained analog signal is fed as partial responsive (PR) reproduction data 6 to the digital information signal reproducing circuit 204. In this circuit 204, the waveform equalization is conducted for the analog signal according to the synchronizing clock signal generated from the phase locked loop (PLL) circuit so as to attain a signal in the digital form, i.e., a digital information signal (digital data) 7. The digital data 7 is then decoded by the maximum likelihood decoder 213 into maximum likelyhood data. The data is further decoded through the decoder 205 into NRZ data, which is then passed via the hard disk controller 206, interface 209, and data bus to the host computer 210.

Figure 2:
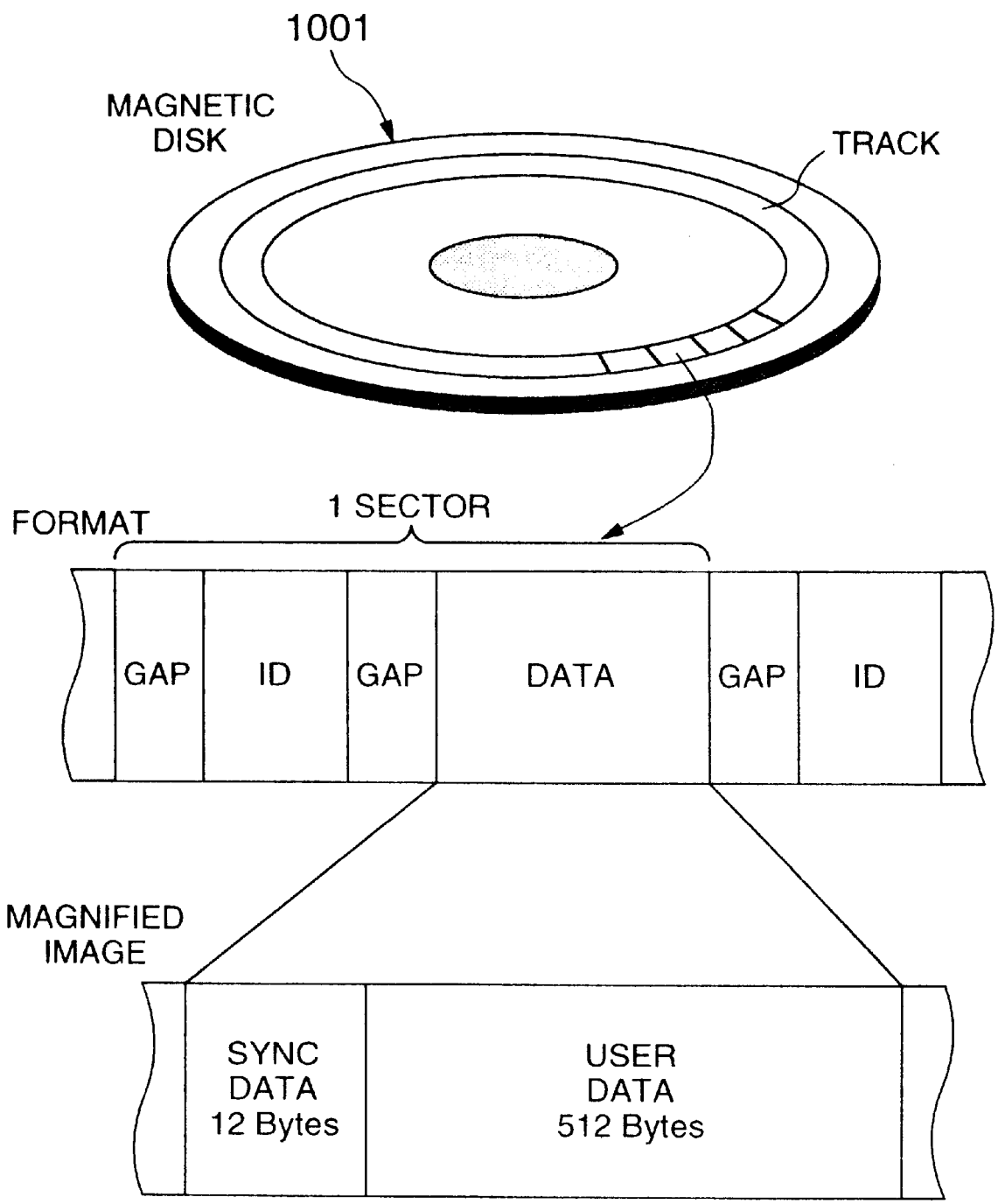
FIG. 2 is a diagram showing the data format of data stored on a magnetic disk in the system of FIG. 1.

Subsequently, the data format of the magnetic disk unit will be described by referring to FIG. 2. In the magnetic disk unit, the magnetic storage media (disk) 1001 is formatted into concentric tracks, each track including a plurality of sectors. The sector primarily includes two regions, namely, an identifier field in which a sector number or the like is stored and a data field in which data is stored. Moreover, each of the identifier and data fields includes sync data in a starting portion thereof. The sync data field is used as a synchronizing signal area to synchronize the timing clock signal on the receiver side with the read data. While the sync data is being read, the receiver side is required to completely finish the synchronization of the timing clock signal. Ordinarily, the sync data is required to be about 20 bytes to about 30 bytes for each sector. However, according to the present invention, at most 12 bytes are necessary for the sync data. This consequently minimizes the portion of the user data storage area which is occupied by the sync data on the magnetic disk. This leads to improvement of the format efficiency (the ratio of formatted capacity to non-formatted capacity).

Figure 3:
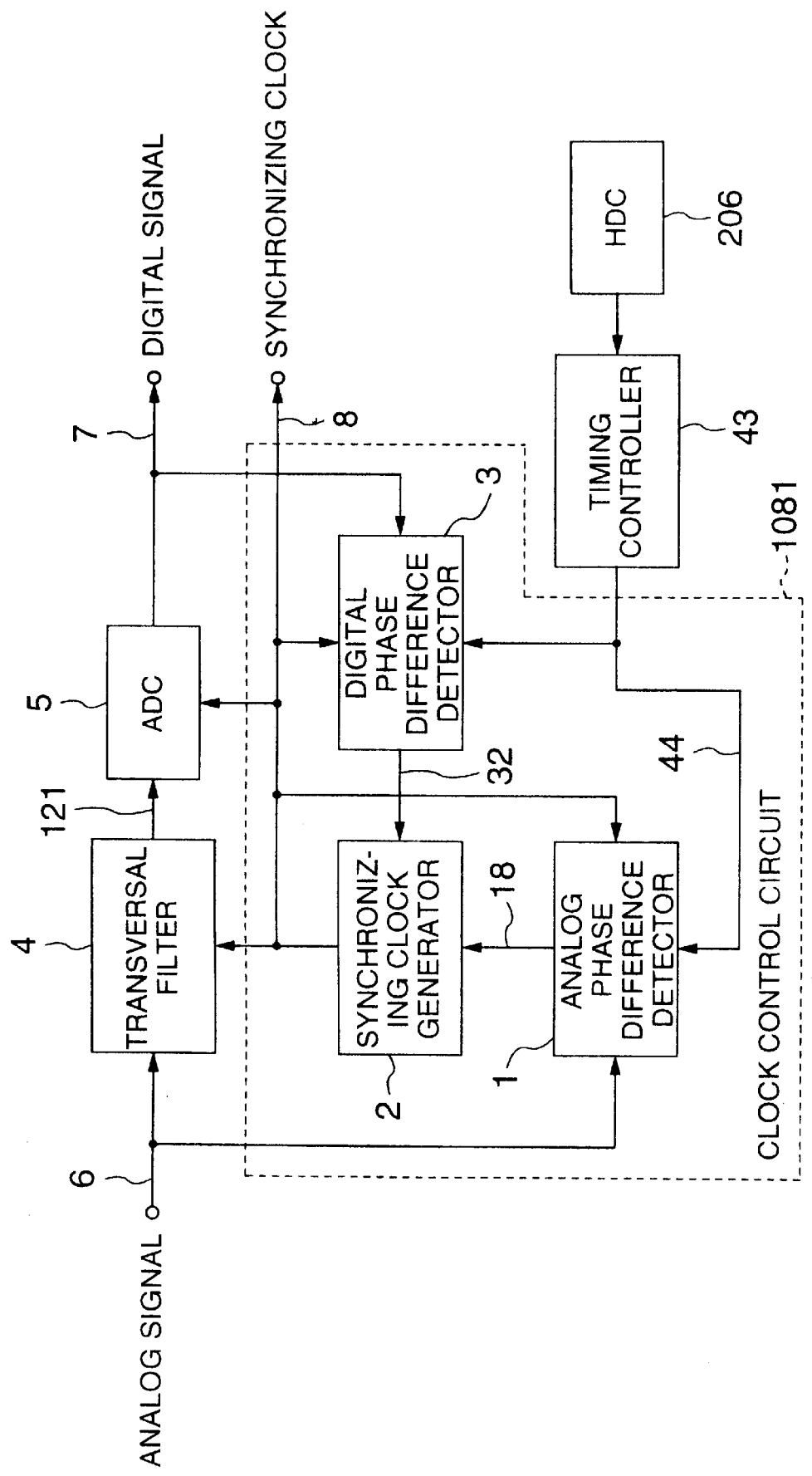
FIG. 3 is a block configuration diagram showing an embodiment of the digital information signal reproducing circuit according to the present invention.
Figure 4:
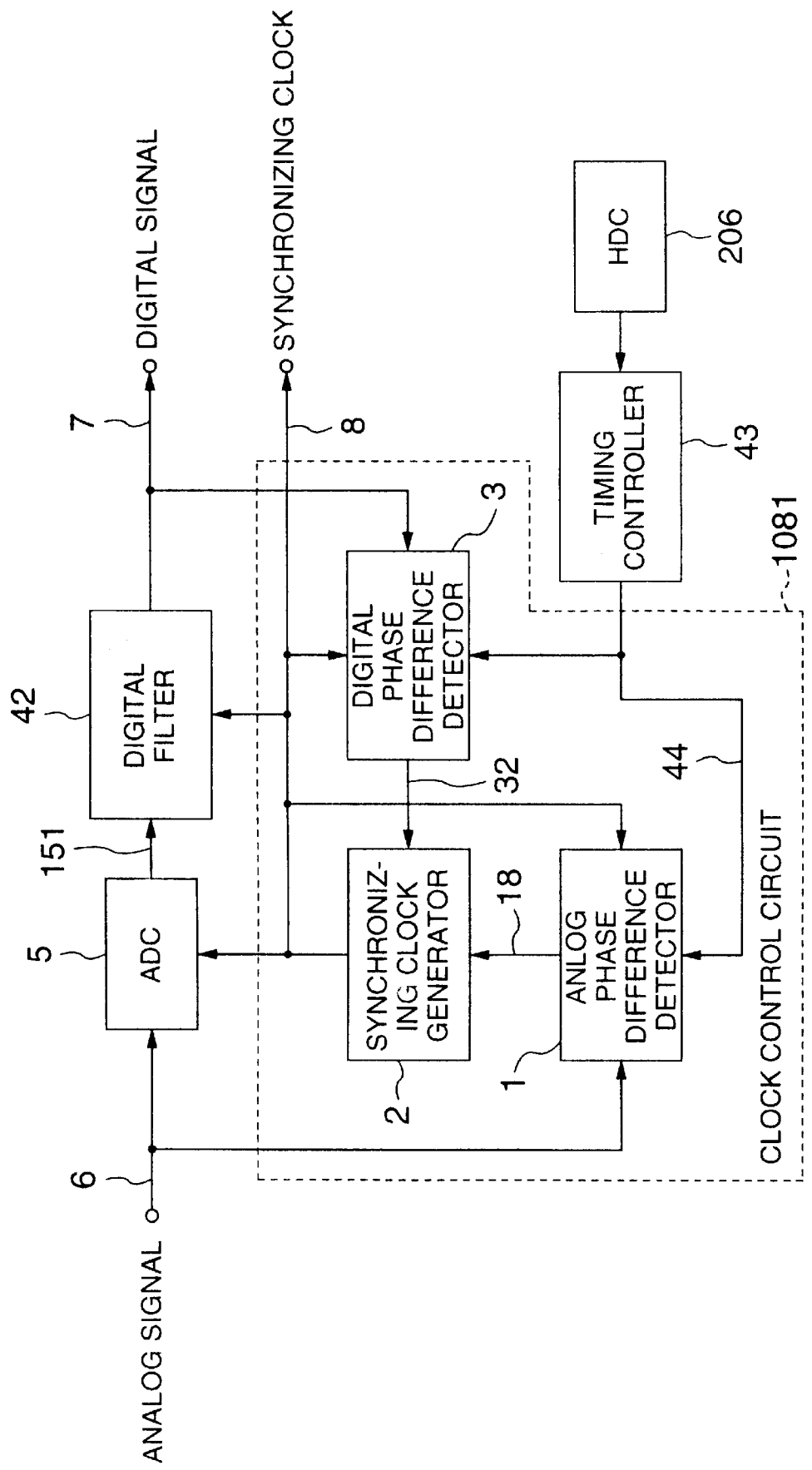
FIG. 4 is a block configuration diagram showing another embodiment of the digital information signal reproducing circuit according to the present invention.
Figure 5:
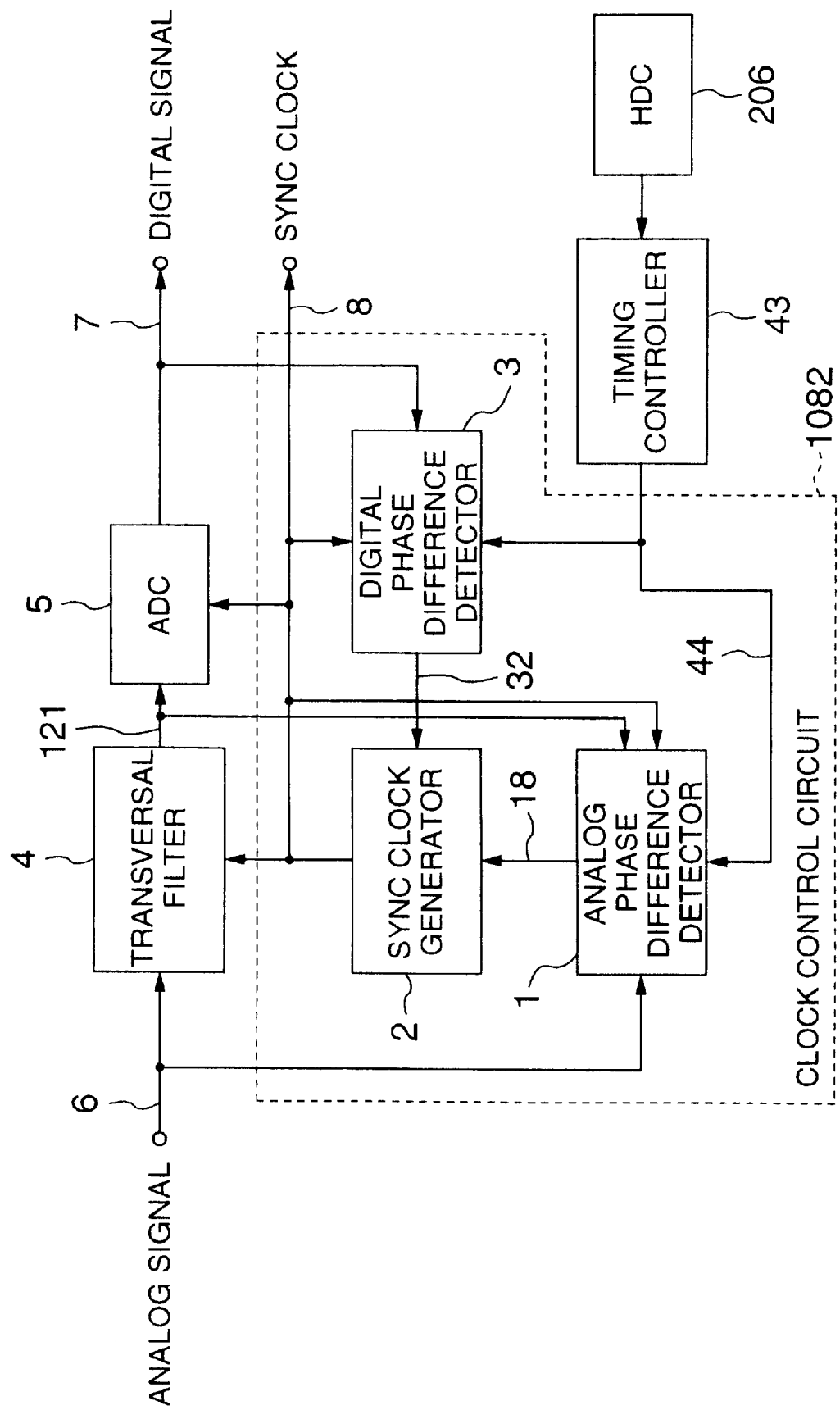
FIG. 5 is a block configuration diagram showing further another embodiment of the digital information signal reproducing circuit according to the present invention.

Next, the digital information signal reproducing circuit 204 of FIG. 1 will be specifically described. FIGS. 3 to 5 show various types of embodiments of the digital information signal reproducing circuit 204.

First, the embodiment of the digital information signal reproducing circuit 204 will be described with reference to FIG. 3. Reference numeral 4 indicates a transversal filter for receiving a partial responsive analog signal 6 delivered from the pre-equalizer (analog filter 203) of FIG. 1 and achieves a waveform equalization for the received signal according to a synchronizing clock signal 8. Numeral 5 denotes an analog-to-digital converter (ADC) circuit 5 for sampling the analog signal from the transversal filter 4 according to the synchronizing clock signal 8 and thereby converting the analog signal into a digital information signal.

Next, description will be given of the primary section of FIG. 3, namely, a clock control circuit 1081 functioning as a digital information signal reproducing PLL. The clock controller 1081 includes an analog phase difference detector 1 for detecting a phase difference at the timing extraction starting point (initial state) and a digital phase difference detector 3 for detecting a phase difference at timing extraction. According to an aspect of the clock control circuit 1081, there are provided a first phase synchronizing loop (analog PLL circuit) for achieving a feedback operation in which an analog phase difference signal (analog timing signal) 18 obtained from the analog phase difference detector 1 according to an activation signal from the hard disk controller 206 is fed back to the synchronizing clock generator circuit 2 and a second phase synchronizing loop (digital PLL circuit) for achieving a feedback operation in which a digital phase difference signal (digital timing signal) 32 obtained from the digital phase difference detector 3 is fed back to the synchronizing clock generator circuit 2. Additionally, there is arranged a timing control circuit 43 for creating a change-over timing signal (indication signal) to invoke either one of the operations of the analog and digital PLL circuits. The change-over timing signal from the timing control circuit 43 is, for example, set to a register, not shown. The contents of the register indicates the change-over point, for example, with a byte position relative to the start position of sync data.

Subsequently, description will be given of operation of the example shown in FIG. 3. Information stored on the storage media 1001 such as a magnetic disk is read therefrom by the head 201 and is then amplified by the amplifier 202. Thereafter, noises are removed from the amplified signal by the pre-equalizer 203 so as to attain an analog signal 6 representing the partial responsive reproduction data. The signal is fed to the analog phase difference detector 1 in which according to the analog signals sampled in response to sampling clock signals clk1 and clk2, which are generated according to the synchronizing clock signal 8 created from the synchronizing clock generator 2 at the initial state and which will be described later, the phase difference detection is conducted on the basis of analog values to resultantly detect an analog phase difference signal (analog timing signal) 18. The output signal 18 is then delivered again to the synchronizing clock generator 2 to accomplish the feedback control operation, thereby achieving the function of the first phase synchronizing loop. As a result, the synchronizing clock 8 is synchronized with the analog signal 6, which is simultaneously supplied also to the transversal filter 4. The analog signal 6 is sampled for the waveform equalization according to the sampling clock signals clk1 and clk2 associated with the synchronizing clock signal 8. The resultant signal, namely, an analog signal 121 thus undergone the waveform equalization is converted by the analog-to-digital converter 5 into a digital value and is outputted therefrom as a digital information signal 7.

The obtained signal 7 is fed to the digital phase difference detector 3 in which the phase difference detection is carried out for the input signal on the basis of digital values so as to produce a digital phase difference signal 32. The signal is then supplied to the synchronizing clock generator circuit 2 to carry out the feedback control operation to thereby achieve the function of the second phase difference synchronizing loop. In the generator circuit 2, after the initial phase synchronization is finished, control is passed to the second phase synchronizing loop in response to a change-over signal 44 created from the timing controller 43. The switching operation may be conducted by the synchronizing clock generator 2 or by the analog and digital phase difference detectors 1 and 3 to supply the pertinent output signal 18 or 32 to the synchronizing clock generator 2.

Consequently, in the first phase synchronizing loop in which the analog phase difference signal 18 obtained by the analog phase difference detector 1 in the initial state is delivered to the synchronizing clock generator 2 to carry out the feedback control operation, there appears only a short clock delay in the loop because the phase synchronization is conducted for analog signals and hence a sufficient phase margin can be afforded. Therefore, the gain of the phase synchronizing loop (the gain for the synchronizing clock generator 2) can be increased and hence the phase capturing operation is achieved at a high speed with the capture range kept unchanged. In other words, according to the first phase synchronizing loop, the phase synchronization can be accomplished without using the analog-to-digital converter 5 and digital phase difference detector 3, which are factors of the delay in the phase synchronization. Consequently, a sufficient phase margin is affordable with a decreased clock delay in the loop. As a result, the gain of the phase synchronization loop is increased and the phase synchronization or phase capturing operation can be carried out at a higher speed with the capture range kept retained. In addition, after the initial phase synchronization is completed, control is transferred to the second phase synchronizing loop in which the digital phase difference signal 32 outputted from the digital phase difference detector 3 is fed to the synchronizing clock generator 2 to achieve the feedback control operation, thereby keeping the synchronized state with a high precision.

Additionally, in a case in which when a phase error occurs when the change-over takes place from the first phase synchronizing loop to the second phase synchronizing loop in the synchronizing clock generator 2, it is desirable to additionally provide a function to correct the phase error.

FIGS. 4 and 5 show alternative embodiments of the digital information signal reproducing circuit 204 of FIG. 1. The embodiment of FIG. 4 differs from that of FIG. 4 only in that an input analog signal 6 is converted by an analog-to-digital converter 5 into a digital signal and then noises are removed from the digital signal by a digital filter 42.

That is, information on the storage media 1001, e.g., a magnetic disk is read therefrom by the head 201 to be amplified by the amplifier 202 and then a high-frequency noise component is removed from the amplified signal by the pre-equalizer 203 to resultantly attain an analog signal 6 representing partial responsive reproduction data. The signal 6 is supplied to the analog-to-digital converter 5 to be transformed into a digital information signal 151. The signal 151 is then fed to a digital filter (digital equalizer) 42 as a transversal filter such that the waveform thereof is equalized, thereby obtaining a digital information signal 7. The phase locked loop circuit (clock control circuit) may be of the same configuration as that of the embodiment shown in FIG. 3.

In addition, the embodiment of FIG. 5 differs from that of FIG. 3 only in that an output signal from the transversal filter 4 is supplied to the analog phase difference detector 1 of the clock control circuit 1082. In the embodiment of FIG. 5, in contrast with that of FIG. 3, a track and hold circuit (not shown) in the output stage of the transversal filter 4 can be commonly used also as a track and hold circuit (not shown) at the input stage of the analog phase difference detector 1. Therefore, the structure of the detector 1 is simplified.

However, the clock delay is increased in the analog phase locked loop circuit.

Figure 6:
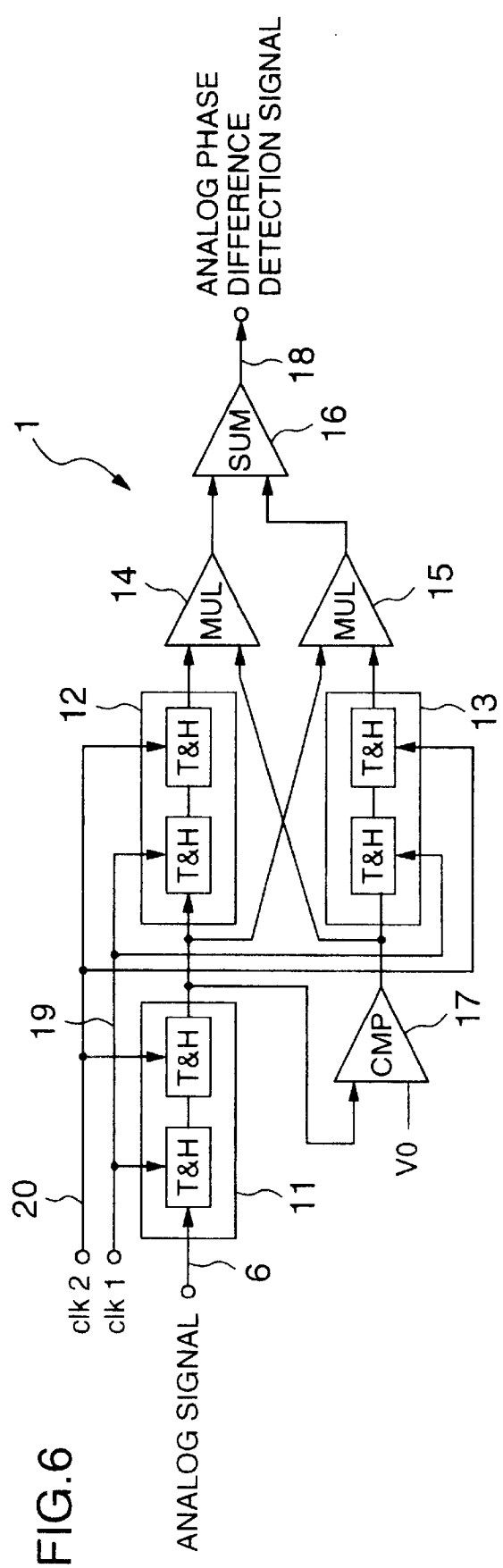
FIG. 6 is a circuit diagram showing a specific example of an analog phase detector circuit of the embodiment of FIG. 3.
Figure 7:
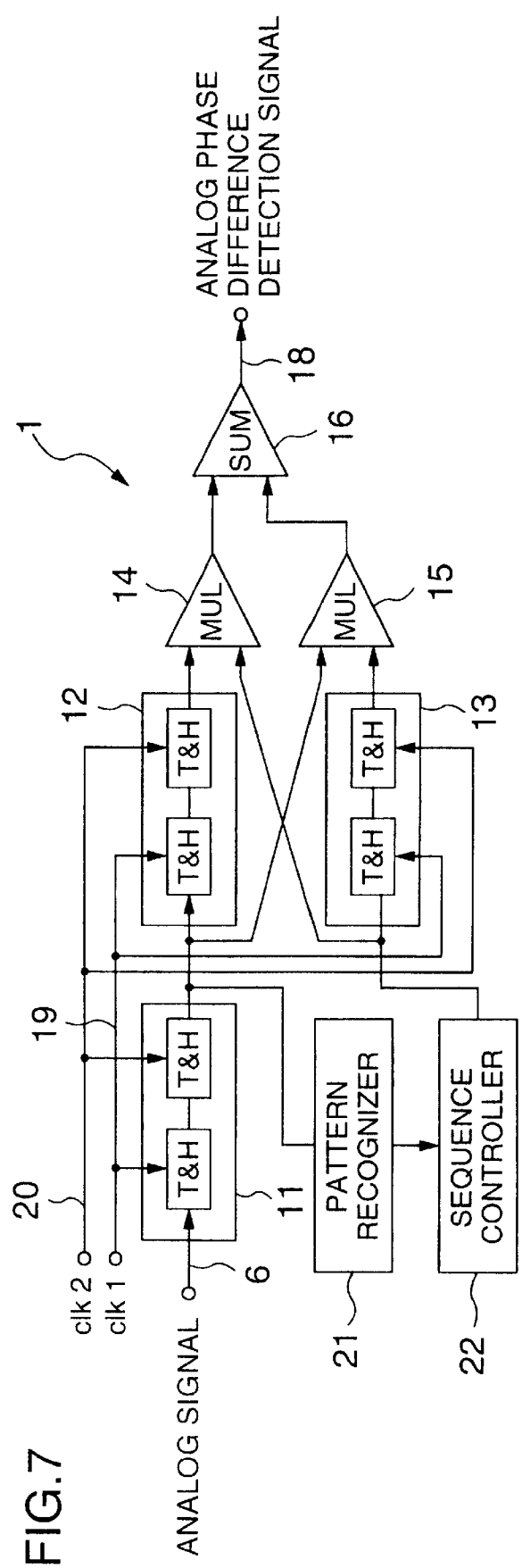
FIG. 7 is a circuit diagram showing a concrete example of an analog phase detector circuit of the embodiment of FIG. 4.
Figure 8:
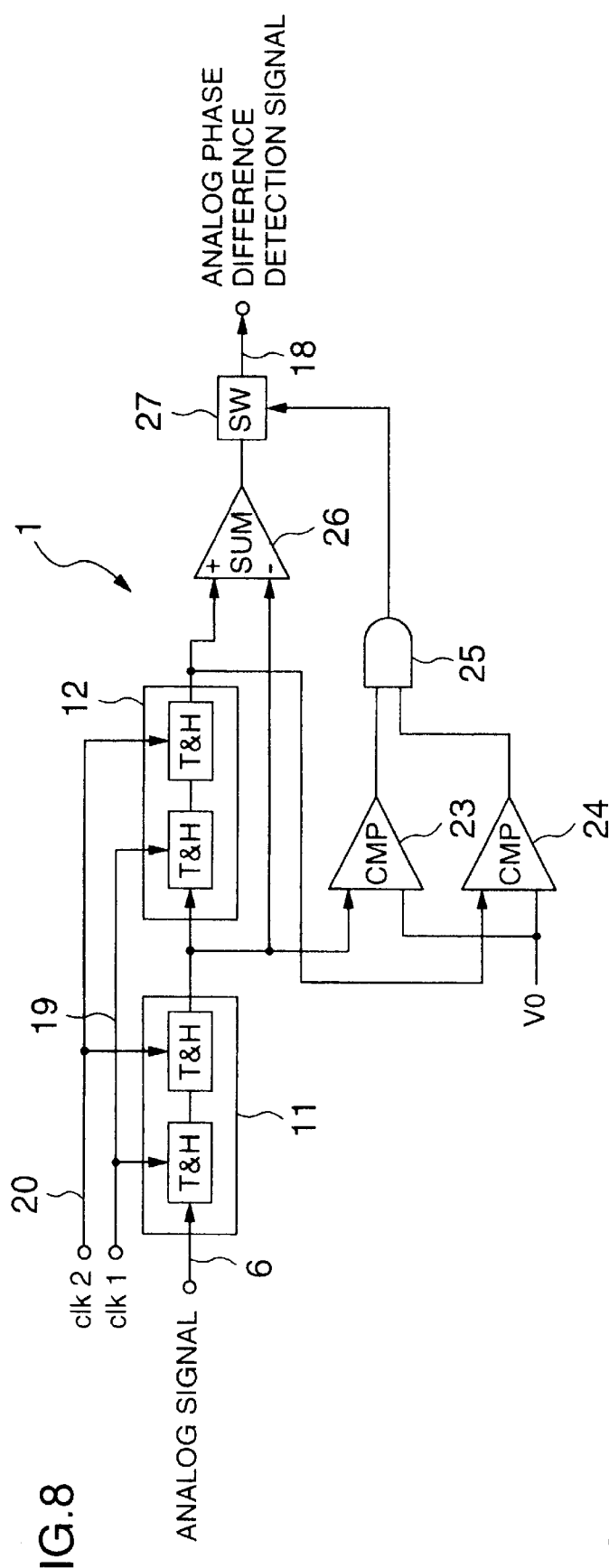
FIG. 8 is a circuit diagram showing a specific example of an analog phase detector circuit of the embodiment of FIG. 5.
Figure 9:
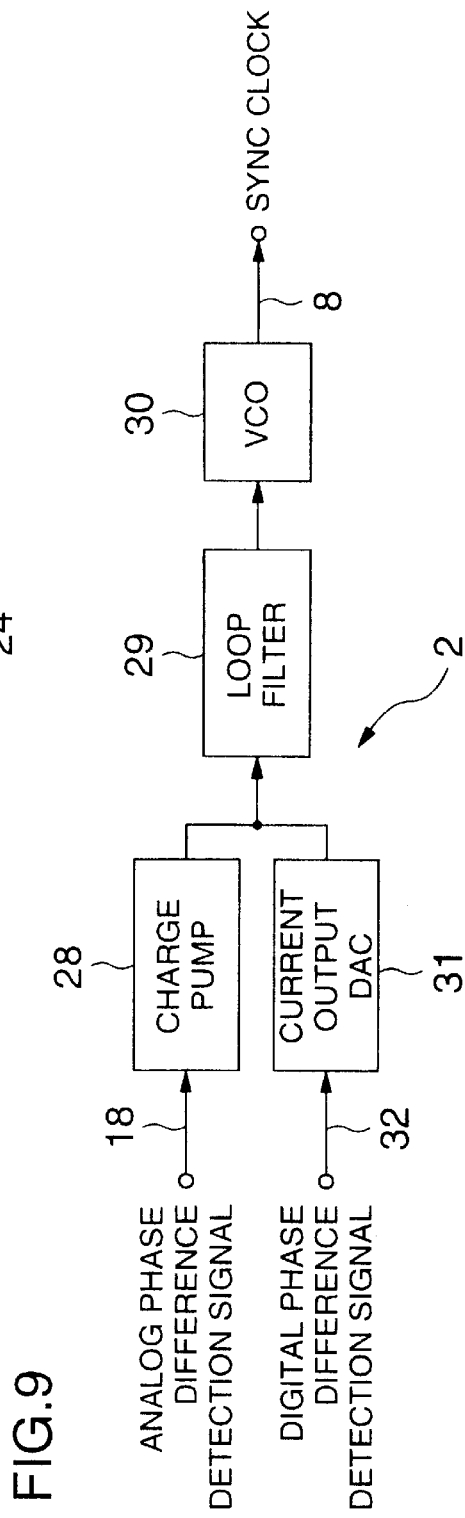
FIG. 9 is a circuit diagram showing a concrete example of a synchronizing clock generator circuit of the embodiment of FIG. 3, 4, or 5.
Figure 10:
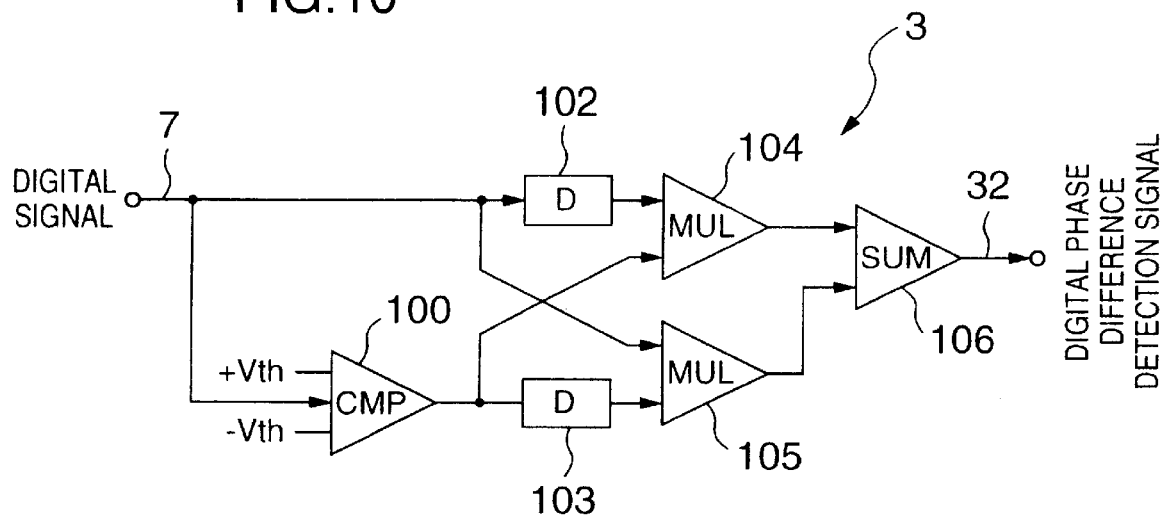
FIG. 10 is a circuit diagram showing a specific example of a digital phase detector circuit of the embodiment of FIG. 3, 4, or 5.
Figure 11:
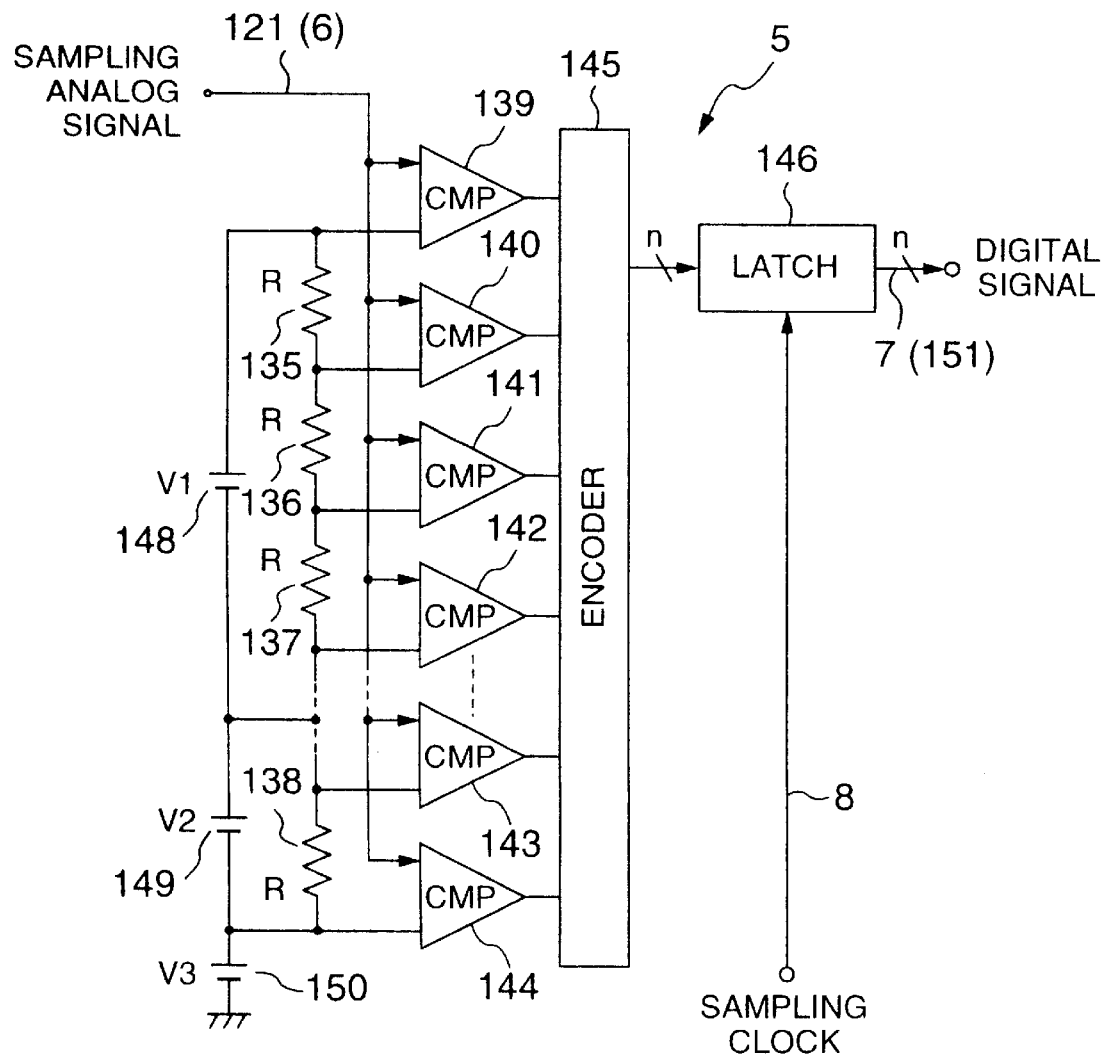
FIG. 11 is a circuit diagram showing a concrete example of an analog-to-digital convertor circuit of the embodiment of FIG. 3, 4, or 5.
Figure 12:
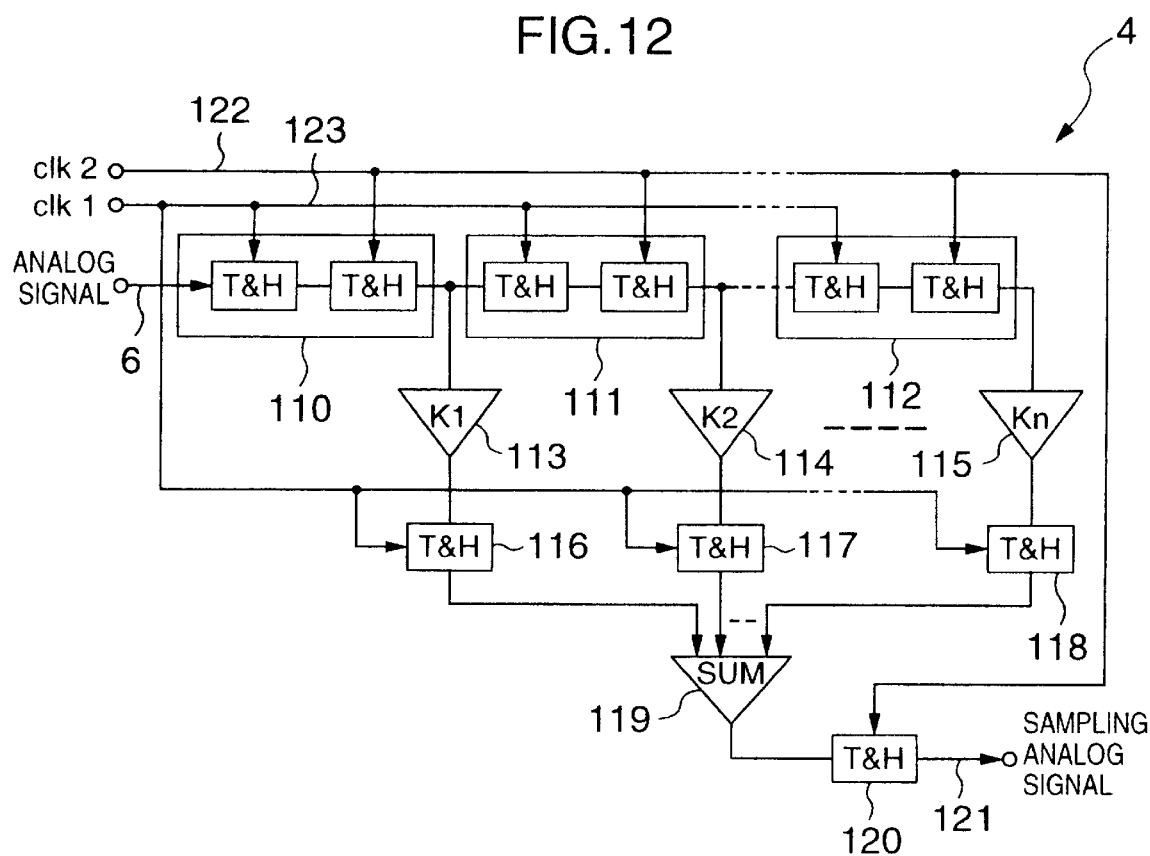
FIG. 12 is a circuit diagram showing a specific example of a transversal filter of the embodiment of FIG. 3, 4, or 5.
Figure 13:
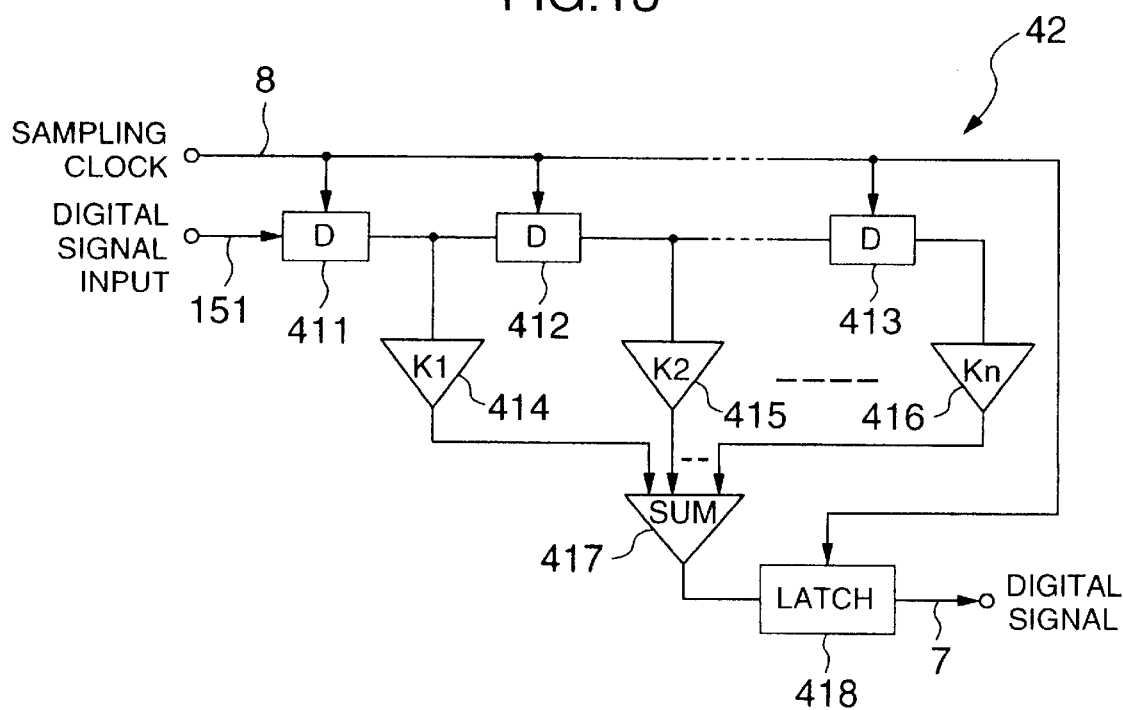
FIG. 13 is a circuit diagram showing a concrete example of a digital filter of the embodiment of FIG. 4.

FIGS. 6 to 13 show specific examples of circuit blocks constituting the digital information signal reproducing circuit of FIGS. 3 to 5. FIGS. 6 to 8 show mutually different concrete examples of the analog phase difference detector 1 of FIGS. 3 to 5. FIG. 9 is a concrete example of the synchronizing clock generator of FIGS. 3 to 5. FIG. 10 represents a specific example of the digital phase difference detector 3 of FIGS. 3 to 5. FIG. 11 shows a concrete example of the analog-to-digital converter 5 of FIGS. 3 to 5. FIG. 12 is a specific example of the transversal filter 4 of FIGS. 3 to 5. FIG. 13 shows a concrete example of the digital filter 42 of FIG. 4. Next, description will be given of these circuits.

FIG. 6 shows a first embodiment of the analog phase difference detector 1. In this example, the partial response class 4 is employed according to the partial response method and a consecutive pattern of [+1,+1,−1,−1] is adopted as the synchronizing pattern. The analog phase difference detector 1 includes three analog delay elements 11 to 13 including two track and hold circuits (T&H), a comparator (CMP) 17, two analog multipliers 14 and 15, and an analog adder (SUM) 16. An analog signal 6 which is reproduction data read from the magnetic disk 1001 or the like is sampled as analog data by a first analog delay element 11 operating with two sampling clock signals clk1 and clk2 attained from the clock signal 8.

The comparator (CMP) 17 compares the input data with a reference voltage V0 to decide a binary expected value of [+1,−1] according to the result of the comparison and produces an output signal representing a polarity. The sampled analog data outputted from the first analog delay element 11 is also supplied to the second analog delay element 2, which then produces delay data therefrom. Additionally, the polarity output signal from the comparator 17 is further fed to the third analog delay element 13, which resultantly creates a delayed polarity signal. The analog multiplier 14 multiplies the delay data generated by the second analog delay element 12 by the polarity signal from the comparator 17. The analog multiplier 15 similarly multiplies the sampled analog data from the first analog delay element 11 by the delayed polarity signal from the third analog delay element 13.

The analog adder (SUM) 16 adds the data from the analog multiplier 14 to that from the analog multiplier 15. Namely, the multipliers 14 and 15 and the analog adder 16 accomplish an operation to obtain the sum of products of these data items so as to produce therefrom an analog phase difference detection signal associated with the phase discrepancy between the sampling clock signals clk1 and clk2 and the analog signal 6. Furthermore, in the operation to create the expected value by the comparator 17, it may also be possible to set hysteresis to the comparator 17 according to the periodic characteristic of the synchronizing pattern to minimize the adverse influence of noises and the like.

FIG. 7 shows an alternative embodiment of the analog phase difference detector 1. In this diagram, the configuration is different from that of FIG. 6 in that the comparator 17 of FIG. 6 is replaced with a pattern recognizing circuit 21 and a sequence control circuit 22.

In other words, like the embodiment of FIG. 6, the embodiment of FIG. 7 includes three analog delay elements 11 to 13 including two track and hold circuits, two analog multipliers 14 and 15, an analog adder 16, a pattern recognizing circuit 21, and a sequence control circuit (sequencer) 22. The analog data 6 of the reproduction data read from the magnetic disk 1001 or the like is sampled as analog data by the first analog delay element 11 operating with two sampling clock signals clk1 and clk2 generated from the synchronizing clock signal 8. The pattern recognition circuit 21 conducts a pattern detection for a plurality of input data items according to the pattern of [+1,−1]. The sequencer 22 processes the pattern detected by the pattern recognizer 21 to produce therefrom a polarity signal in a sequence associated with the periodic characteristic of the synchronizing pattern.

FIG. 8 shows an alternative embodiment of the analog phase difference detector 1. The embodiment of FIG. 8 includes two analog delay elements 11 and 12 including two track and hold circuits, two comparators (CMP) 23 and 24, a logic gate 25, an analog switch (SW) 27, and an analog subtracter (SUM) 26. The analog signal 6, i.e., reproduction data obtained from the magnetic disk or the like is sampled as analog data by the first analog delay element operating according to two sampling clock signals clk1 and clk2 produced from the synchronizing clock signal 8.

The comparator 23 compares the data received from the first analog delay element 11 with a reference voltage V0 to determine a binary expected value of [+1,−1] according to the result of the comparison, thereby outputting a polarity signal. The second analog delay element 12 receives the output signal from the first analog delay element 11. The comparator 24 compares the delay data from the second analog delay element 12 with a reference voltage V0 to determine a binary expected value of [+1,−1] according to the result of the comparison to thereby output a delayed polarity signal. The analog subtracter (SUM) 26 subtracts the data from the first analog delay element 11 from the delayed data from the second analog delay element 12 to output a signal representing the result of the subtraction.

Additionally, using two polarity signals respectively outputted from the comparators 23 and 24, the logic gate 25 generates a control signal to control the analog switch (SW) 27. The switch 27 controls the output from the analog subtracter (SUM) 26 according to the control signal from the logical gate 25 to resultantly output a phase difference detection signal 18. The logical gate 25 outputs therefrom an analog phase difference detection signal 18 for every four samples in the AND logic operation and for every two samples in the ENOR logic operation. With this provision, the analog phase difference detector can be configured in a simplified circuit structure. In addition, in relation to the operation of the comparators to generate the expected values, it may also be possible to provide hysteresis for the comparator according to the periodic characteristic of the synchronizing pattern to minimize the adverse influence of noises and the like.

Subsequently, referring to FIG. 9, description will be given of specific configurations of the synchronizing clock generator 2 shown in FIGS. 3 to 5. The circuit 2 includes a charge pump 28 for transforming the analog phase difference signal 18 from the analog phase difference detector 1 into a current output signal, a digital-to-analog converter (DAC) 31 for converting the digital phase difference signal 32 from the digital phase difference detector 3 into a current output signal, a loop filter 29 for transforming a current signal into a voltage signal, and a voltage controlled oscillator 30 for producing therefrom a synchronizing clock signal 8 having a frequency associated with a voltage inputted thereto. In this regard, the voltage controlled oscillator 30 may generate sampling clock signals clk1 and clk2 according to the synchronizing clock signal 8. Moreover, it may also be possible that the transversal filter 4 produces the sampling clock signals clk1 and clk2 according to the synchronizing clock signal 8 from the voltage controlled oscillator 30. Furthermore, the analog and phase difference detectors 1 and 3 may similarly generate the sampling clock signals clk1 and clk2.

Next, operation of the synchronizing clock generator 2 will be described. At the timing extraction starting point (in the initial state), an analog phase difference signal 18 created by the analog phase difference detector 1 is fed to the charge pump 28 to be converted into a current output signal. The current signal is then transformed by the loop filter 29 into a voltage signal to supervise the frequency of the synchronizing clock signal 8 from the voltage controlled oscillator 30. As a result, the components as a result form a first phase synchronizing loop so that the synchronizing clock signal 8 is synchronized with the analog signal 6.

In a last-half stage of timing extraction, the digital phase difference signal 32 from the digital phase difference detector 3 is fed to the digital-to-analog converter 31 to be outputted therefrom as a current output signal. The current signal is then transformed through the loop filter 29 into a voltage signal, which controls the frequency of the synchronizing clock signal 8 of the voltage controlled oscillator 30. The system resultantly configures a second phase synchronizing loop such that the synchronizing clock signal 8 can be synchronized with the digital signal 7.

In the operation of the loop system, after the initial phase synchronization is completely established by the first phase synchronizing loop, control is passed to the second phase synchronizing loop. For the switching or change-over operation, it is only required to select the input signal to the loop filter 29. Namely, it is only necessary to select either one of the output from the charge pump 28 and the output from the digital-to-analog converter 31. On the input side (analog phase difference detector 1) of the charge pump 28 and on the input side (digital phase difference detector 3) of the digital-to-analog converter 31, it may also be possible to decide which one of the input signals respectively thereof is to be selected. Alternatively, on the output side of the charge pump 28 and on the output side of the digital-to-analog converter 31, it may be decided which one of the output signals respectively thereof is to be selected as the input to the loop filter 29.

Consequently, since the clock delay is relatively short in the first phase synchronizing loop and a sufficient phase margin can be afforded, the gain of the phase synchronizing loop is increased and the synchronization capture operation is accomplished at a high speed with the capture range kept retained. In addition, after the initial phase synchronization is thus finished, control is changed over to the second phase synchronizing loop, which keeps the synchronized state with a high precision. Incidentally, when a phase error occurs in the operation to transfer control from the first phase synchronizing loop to the second phase synchronizing loop, it is desirable to additionally provide a function to correct the phase error.

Referring now to FIG. 10, description will be given of specific configurations of the digital phase difference detector 3 of FIGS. 3 to 5. In this embodiment of the detector 3, the partial response class 4 is adopted in the partial response method and [+1,0,−1] is employed for 3-value equalization. The detector 3 includes a comparator (CMP) 100, two delay circuits (D) 102 and 103, two multipliers (MUL) 104 and 105, and an adder (SUM) 106. In operation, after the initial phase synchronization chronization is finished, when control is passed according to a signal from the timing control circuit 43 to the second phase synchronizing loop (at timing extraction of random data at high precision), the comparator 100 creates an expected value of [+1,0,−1] according to the digital signal 7 such that the delay circuits 102 and 103 delay the digital signal 7 and the expected value to obtain delayed data items. The multiplier 104 multiplies the delayed data from the delay circuit 102 by the expected value from the comparator 100, whereas multiplier 105 multiplies the delayed data of the expected value from the delay circuit 103 by the digital signal. Resultant values are respectively fed to the adder 106 to be added to each other. The result of addition is outputted therefrom as a digital phase difference detection signal 32.

FIG. 11 shows an embodiment of the analog-to-digital converter (ADC) 5. The converter 5 includes three voltage sources (V1) 148, (V2) 149, and (V3) 150 for deciding signal input ranges, n voltage dividing resistors (R) 135 to 138 connected between the voltage sources 148 and 149, n comparators (CMP) 139 to 144 for comparing voltages respectively obtained from the dividing resistors 135 to 138 with a sampling analog signal 121 or an analog signal 6, and encoder 145 for encoding outputs from the n comparators 139 to 144 into digital information signals, a latch 146 for latching data (encoded digital information signal) from the encoder 145 and thereby outputting a digital information signal 7 or 151. In the analog-to-digital converter 5, the voltage level of the sampling analog signal 121 or analog signal 6 inputted to the comparators 139 to 144 is compared with voltages decided by the resistors 135 to 138 and then the results of the comparisons are encoded by the encoder 145 to be outputted as a digital information signal 7 or 151 at timing synchronized with the synchronizing clock signal (sampling clock signal) 8.

In FIG. 12, the transversal filter 4 includes n analog delay elements 110 to 112 for sequentially delaying the analog signal 6 according to two sampling clock signals, i.e., sampling clock signals clk1 and clk2 attained from the synchronizing clock signal 8. Each of the delay elements 110 to 112 includes two track and hold circuits respectively connected to signal lines 123 and 122 respectively receiving the sampling clock signals clk1 and clk2.

The transversal filter 4 further includes n coefficient multipliers 113 to 115 for multiplying analog signals sampled by the analog delay elements 110 to 112 respectively by coefficients K1 to Kn, n latching track and hold circuits 116 to 118 for latching in response to the sampling clock clk1 sampling analog signals undergone the multiplications respectively with the coefficients K1 to Kn and respectively outputted from the coefficient multipliers 113 to 115, an adder (SUM) 119 for adding the sampling analog signals respectively latched in the track and hold circuits 116 to 118, and a latching track and hold circuit 120 for latching at timing of the sampling clock signal clk2 the sampling analog signal resultant from the addition by the adder (SUM) 119 and conducting a waveform equalization for the latched signal, thereby outputting a sampling analog signal 121.

In this manner, the transversal filter 4 of FIG. 12 operates according to two sampling clock signals including the sampling clock signals clk1 and clk2 to achieve a waveform equalization for the analog signal 6 to thereby produce the sampling analog signal 121. In this connection, it is desirable to appropriately control the coefficient values K1 to Kn associated with the coefficient multipliers 113 to 115.

FIG. 13 shows a concrete embodiment of the digital filter (digital equalizer) 42 of FIG. 4. The digital filter 42 includes n series connected delay circuits (D) 411 to 413 for sequentially delaying the digital signal 151 in response to the synchronizing clock (sampling clock) signal 8, n multipliers 414 to 416 for multiplying digital signals sampled respectively by the delay circuits 411 to 413 by coefficients K1 to Kn, an adder (SUM) 417 for adding to each other sampling digital signals produced through the multiplications by the multipliers 414 to 416, and a latch circuit 418 for latching by the sampling clock signal the sampled digital information signal resultant from the addition and conducting a waveform equalization for the signal so as to output a sampling digital signal 7. Namely, the digital filter 42 conducts a waveform equalization for the digital signal 151 received from the analog-to-digital converter 5 to thereby produce a digital signal 7.

According to the embodiments of FIGS. 4 and 5 described above, the analog timing extracting section (analog phase difference detector) to extract timing from the analog signal minimizes the clock delay in the transversal filter and analog-to-digital converter so as to increase the phase margin of the phase synchronizing loop. Therefore the loop gain can be increased and the phase synchronization can be accomplished at a high speed in the initial stage of phase synchronization. In addition, after the phase synchronization is initially completed, the phase synchronizing loop is switched to the digital timing extraction section (digital phase difference detector) in which the timing extraction is carried out according to the sampled digital signal. Consequently, the state of phase synchronization can be retained with a high precision. This as a result leads to a phase synchronizing method in which the overall period of time required to capture the phase synchronization is minimized with a sufficient capture range kept guaranteed while keeping the high-precision synchronized state.

In accordance with the embodiment of FIG. 6, when the sync field is in the initial state, the clock delay is relatively short and hence a sufficient phase margin is affordable in the first phase synchronizing loop, which enables the gain of the phase synchronizing loop to be increased. Therefore, the phase synchronization capturing operation can be conducted at a high speed while guaranteeing the satisfactory capture range. Furthermore, control is switched to the second phase synchronizing loop after the initial phase synchronization is finished, thereby keeping the synchronization state with a high precision.

As a result, for the sync field of each sector including about 12 bytes less than about 15 bytes, the synchronization of the timing clock signal 8 can be sufficiently achieved.

Moreover, according to the embodiments of FIGS. 4 to 6 above, the sync field can be minimized in the format to improve the format efficiency (ratio of the formatted capacity to the non-formatted capacity) of the magnetic disk unit, leading to an advantage of a large capacity of the magnetic disk unit.

Subsequently, referring to FIGS. 14 to 17, FIGS. 18A and 18B, and FIGS. 19 and 20, description will be given in detail of the configuration and operation of the clock control circuit achieving an important function according to the present invention.

Figure 14:
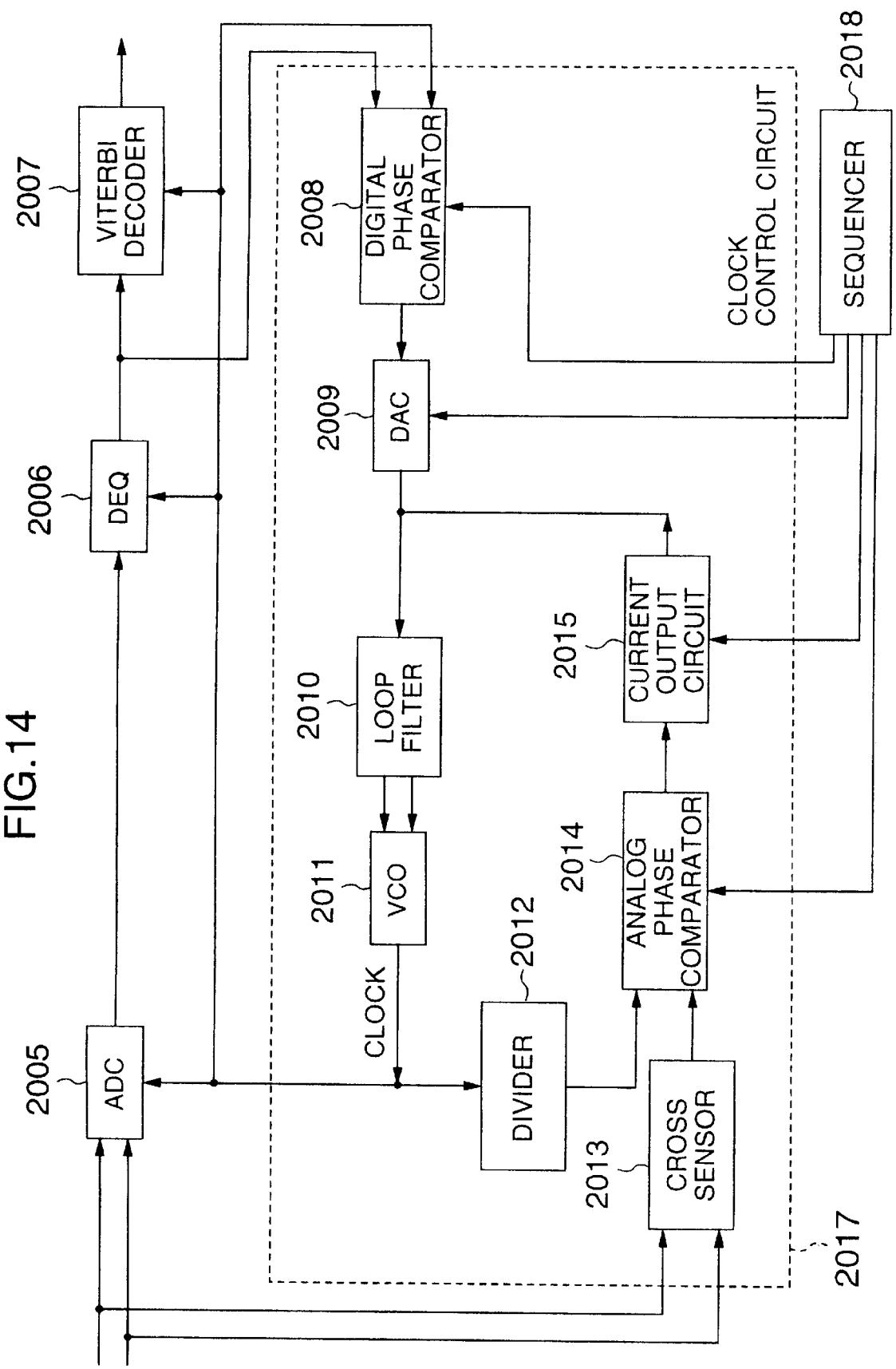
FIG. 14 is a block configuration diagram showing another embodiment of the digital information signal reproducing circuit according to the present invention.

FIG. 14 shows an embodiment of the digital information signal reproducing circuit, centered on the clock control circuit 2, according to the present invention. The circuit 2017 includes a cross sensor or detector 2013 for extracting timing of intersection of differential signals read from the recording media, an analog phase difference comparator 2014 for detecting a phase error between a signal from the cross sensor 2013 and a signal from a divider or de-multiplier 2012, a current output circuit 2015 for allocating an appropriate amount of current to a signal outputted from the analog phase comparator 2014, a loop filter 2010 for removing a high-frequency component from a signal inputted thereto, a voltage controlled oscillator (VCO) 2011 an oscillation frequency of which is controlled by an output signal from the loop filter 2010, a digital phase comparator 2008 for detecting a phase error according to a signal produced from a digital waveform equalizer (DEQ) 2006, and a digital-to-analog converter (DAC) 2009 for transforming a signal from the digital phase comparator 2008 into an appropriate amount of current.

When the sequencer 2018 activates the analog phase comparator 2014 and the current output circuit 2015 and terminates operations of the digital phase comparator 2008 and digital-to-analog converter 2009, there is configured an analog control loop including the divider 2012, analog phase comparator 2014, current output circuit 2015, loop filter 2010, and voltage controlled oscillator 2011. The analog control loop is to be referred to as an analog phase locked loop (PLL) herebelow.

Additionally, when the sequencer 2018 activates the digital phase comparator 2008 and the digital-to-analog converter 2009 and stops operations of the analog phase comparator 2014 and the current output circuit 2015, there is configured a digital phase locked loop including the digital phase comparator 2008, digital-to-analog converter 2009, loop filter 2010, voltage controlled oscillator 2011, analog-to-digital converter 2005, and waveform equalizer 2006.

Compared with the digital PLL, the analog PLL has a shorter loop delay and hence a higher gain can be obtained in a stable system. Therefore, the synchronization capturing range can be increased and the period of time to capture synchronization can be decreased. Additionally, in the embodiment of FIG. 14, since the differential signals read from the recording media are directly supplied to the clock control circuit 2017, the loop delay is considerably minimized.

However, the cross sensor 2013 of the analog PLL detects an intersection of the differential reproduction signals. Consequently, when the sync data to be reproduced includes a fixed pattern such as [1,1,−1,−1] in which the cycle of crosspoints matches that of reproduced signals, the phase comparison can be normally achieved by the analog phase comparator 2014. However, for random data for which the waveform equalization has not been conducted, the cycle of crosspoints does not match that of reproduced signals and hence the phase comparison cannot be appropriately accomplished.

To overcome this difficult, in the clock reproduction for random data, there is employed a digital phase comparator 2008 including a digital PLL to detect a phase error on the basis of amplitude values contained in a signal outputted from the equalizer.

In consequence, after the frequency is captured at a high speed by the analog PLL in the sync data reproduction, control is changed over to the digital PLL before random data is reproduced.

Thanks to the switching operation between the analog and digital phase locked loops, the frequency capture range is expanded and the frequency capturing time is minimized.

In addition, the reduction of the capturing time leads to minimization of the sync data, and hence the user data recording capacity is increased according to the minimized amount of sync data.

Figure 15:
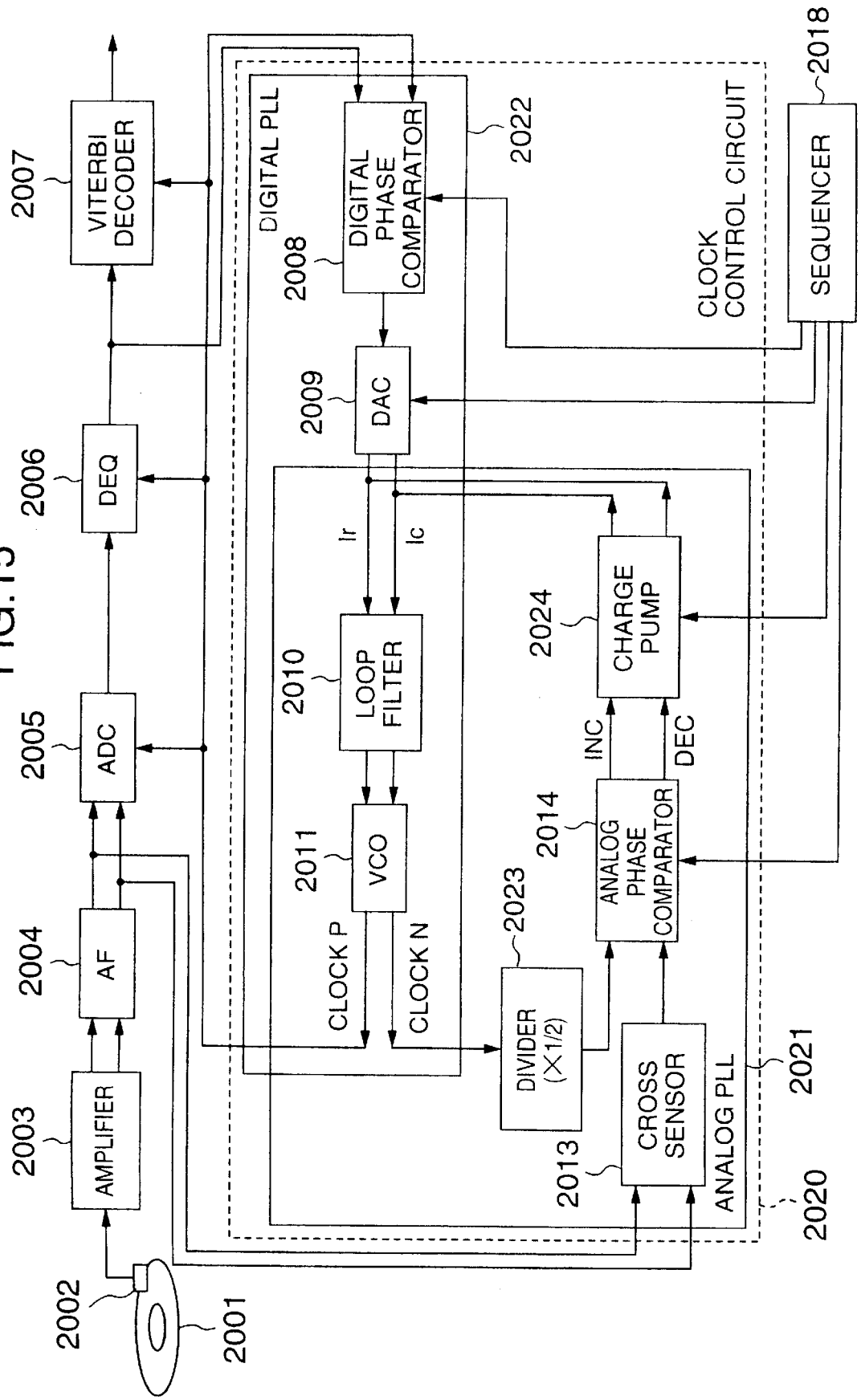
FIG. 15 is a block configuration diagram showing still an embodiment of the digital information storage according to the present invention.

FIG. 15 shows in a specific block diagram an embodiment of the magnetic disk device employing the digital information signal reproducing circuit in the embodiment of FIG. 14. As can be seen from the configuration of FIG. 15, the clock control circuit 2020 of this embodiment includes an analog PLL 2021 and a digital PLL 2020. The analog PLL 2021 includes a cross sensor 2013 for extracting timing of an intersection of differential signals from an active filter 2004, a divider circuit 2023 for dividing a clock signal by two, an analog phase comparator 2014 for detecting a phase error between a signal from the cross sensor 2013 and a signal from the divider 2023, a charge pump (CP) 2024 for allocating an appropriate amount of current to a signal from the analog phase comparator 2014, a loop filter 2010, and a voltage controlled oscillator 2011.

On the other hand, the digital PLL 2022 includes a digital phase comparator 2008 for detecting as a phase error a gradient of amplitude values of two adjacent points of signals from a digital waveform equalizer 2006, a digital-to-analog converter 2009 for supplying an appropriate amount of current for the phase error, a loop filter 2010 for removing a high-frequency component from an signal inputted thereto, and a voltage controlled oscillator 2011 a clock frequency of which is controlled by a signal from the loop filter 2010.

However, the loop filter 2010 and voltage controlled oscillator 2011 are shared between the analog and digital PLLs 2021 and 2022. When the analog PLL 2021 is to be operated, the sequencer 2018 activates the analog phase comparator 2014 and current output circuit 2015 and stops operations of the digital phase comparator 2008 and digital-to-analog converter 2009. On the other hand, when the digital PLL 2021 is to be operated, the sequencer 2018 activates the digital phase comparator 2008 and digital-to-analog converter 2009 and digital-to-analog converter 2009 and terminates operations of the analog phase comparator 2014 and current output circuit 2015.

Figure 16:
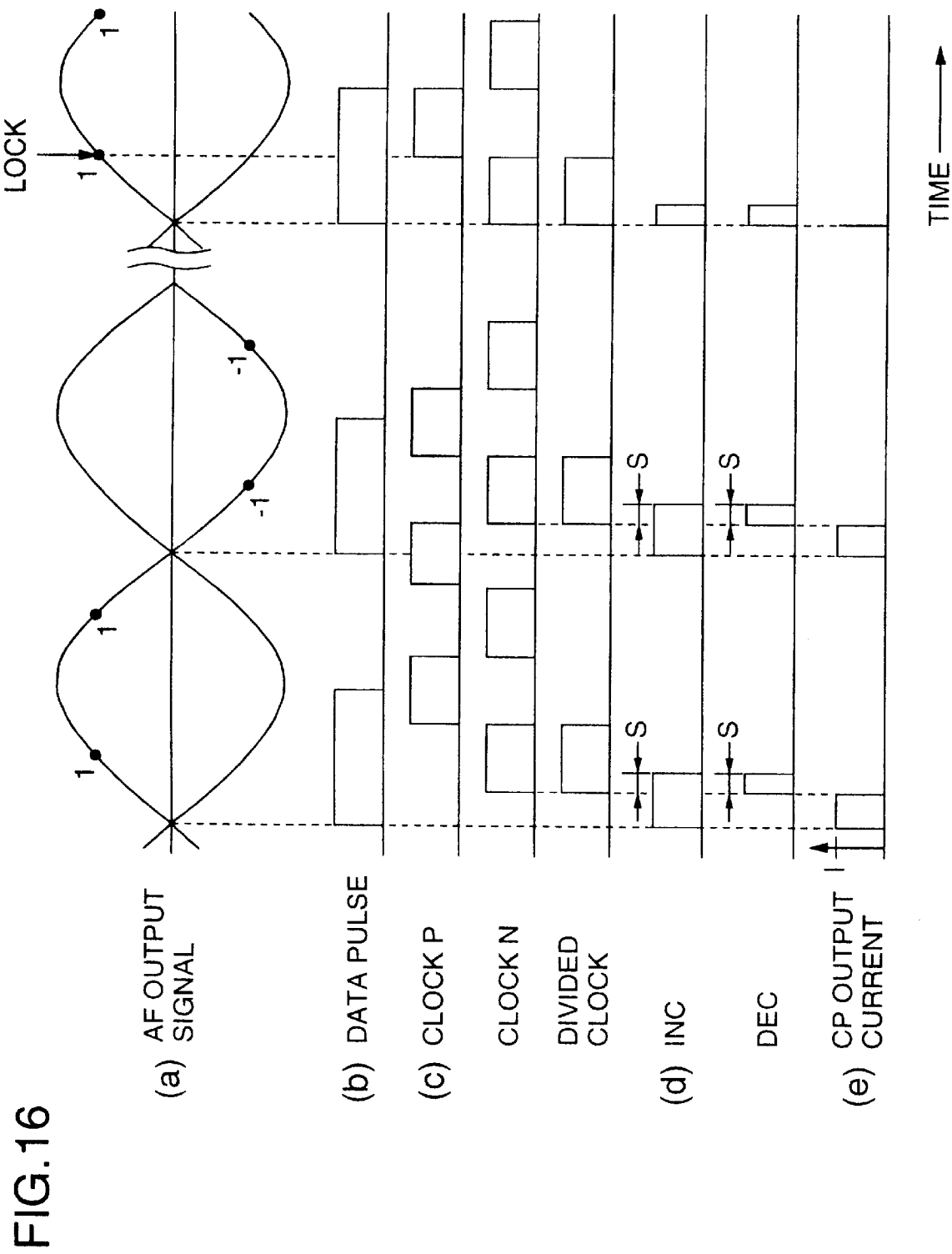
FIG. 16 is a graph for explaining signal waveforms in the operation of the embodiment of FIG. 15.

Referring next to FIG. 16, description will be given of the operation and synchronization capturing process of the clock control circuit 2020.

First, in the analog PLL 2102, the cross sensor 2013 detects a crosspoint of differential signals from the active filter 2004 and thereby produces a data pulse shown in (b) of FIG. 16. Between the clock signals P and N, there exists a phase difference of π such that the clock signal N is divided by two in the divider 2023 into a divided clock signal as shown in (c) of FIG. 16.

The analog phase comparator 2014 achieves a timing comparison between the data pulse and the divided clock signal. When the divided clock signal is delayed as shown in (d) of FIG. 16, the comparator 2014 produces an increment (INC) pulse. When the clock signal is advanced similarly as shown in the graph, there is generated a decrement (DEC) pulse. Since widths of the increment (INC) and decrement (DEC) pulses are decreased in a high-speed transfer operation, it becomes difficult to sense these pulses. To avoid such a disadvantage event, the width of these pulses is increased by s before the pulses are outputted from the comparator 2014 so as to facilitate the detection of the pulses.

Subsequently, the charge pump 2014 supplies an appropriate current for a period of time in which the increment or decrement pulse is being outputted from the comparator 2014. In this situation, there is conducted an operation of "increment (INC) pulses—decrement (DEC) pulses" to delete the added width s, thereby producing a current in proportion to the phase difference. According to the current thus outputted, the voltage controlled oscillator 2011 synchronizes the clock signal with the reproduction signal.

In the embodiment of FIG. 15, there is employed the PRML procedure in which the stable points of clock signals are set to [1,1,−1,−1] according to the PR equalization timing, not to the peak and zero points. Therefore, the operation timing of the analog-to-digital converter 2005 and other circuits is controlled according to the clock signal P having a phase difference of π relative to the clock signal N. Synchronizing the clock signal N with the crosspoint (zero point) of the differential signals, the sampling timing related to the clock signal P can be fixed to [1,1,−1,−1] as shown in (a) of FIG. 16, which is quite favorable for the timing control operation, for example, in the PR equalization.

It is also to be appreciated that the clock signal N is used to control the operation timing of the analog-to-digital converter 2005 and other circuits. In such a case, the sampling timing is fixedly set to [1,1,−1,−1] in the stabilized state.

The analog PLL 2021 has a very short loop delay of about 0.5 clock. Consequently, a high gain can be set thereto for a wide frequency capturing range and a short capturing time. However, when the frequency and phase once captured are desired to match those of user data, since the user data has a random pattern, the cycle of crosspoint detected by the cross sensor 2013 does not match that of the reproduction signal. Namely, the analog phase comparator 2014 does not operate appropriately in this case.

To overcome this difficulty, in the clock signal reproduction in association with the user data, the digital phase comparator 2008 detects the phase error according to the amplitude value of the signal from the digital waveform equalizer 2006. The digital-to-analog converter 2009 then transforms a signal outputted from the digital phase comparator 2008 into an appropriate amount of current to control the clock signal by use of the loop filter 2010 and voltage controlled oscillator 2011.

Next, referring to the data format example of FIG. 17, description will be given of the change-over timing between the analog and digital PLLs 2021 and 2022.

Figure 17:
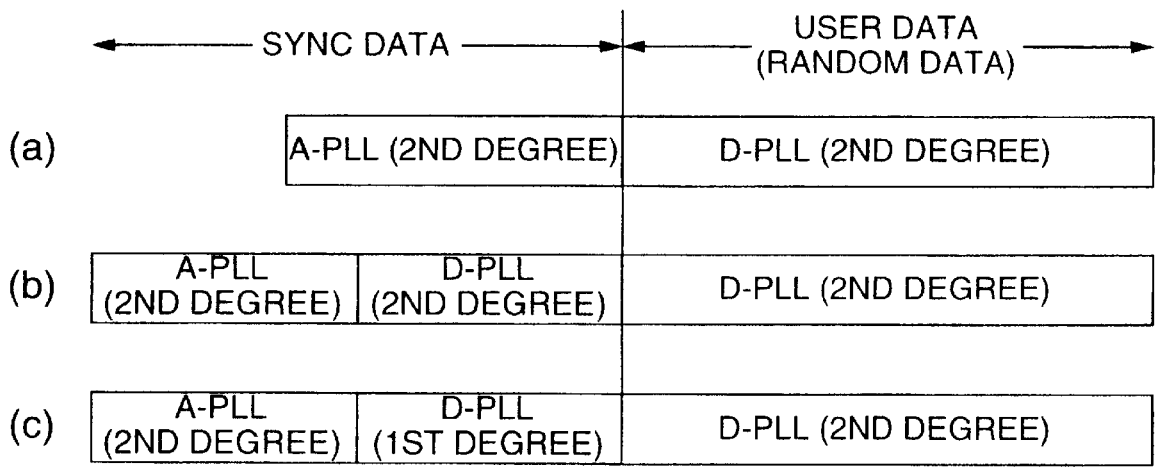
FIG. 17 is a diagram for explaining timing to determine the use of the analog or digital PLL in the sync capturing operation.

The example of (a) of FIG. 17 indicates an operation in which the frequency and phase are captured by the analog PLL 2021 during the reproduction of sync data and then control is passed to the digital PLL 2022 immediately before the user data reproduction is conducted. The amount of sync data is required to correspond to a period of time necessary for the analog PLL 2021 to complete the capturing of the frequency and phase. To minimize the capturing period of time, it is only required to set the gain to a large value. However, this increases the amount of output current from the charge pump, leading to trade-off with the power consumption. When the circuit of FIG. 15 is applied to a small-sized magnetic disk unit, the capturing time can be minimized to about eight bytes in terms of sync data. However, the detecting position varies between the analog and digital PLLs, the stable phase point is shifted due to influences of the fluctuation in the characteristics of circuits, it may possibly occur that the capturing time is elongated.

In this case, prior to the user data reproduction, the stable phase is corrected by the analog PLL according to the discrepancy between the stable phase point of the digital PLL and that of the analog PLL. To solve this problem, there may be disposed an automatic phase adjusting circuit. Alternatively, as shown in (b) of FIG. 17, it may also be possible to operate the digital PLL in the sync data region (about four bytes) to capture the phase discrepancy for the adjustment thereof.

Figure 22:
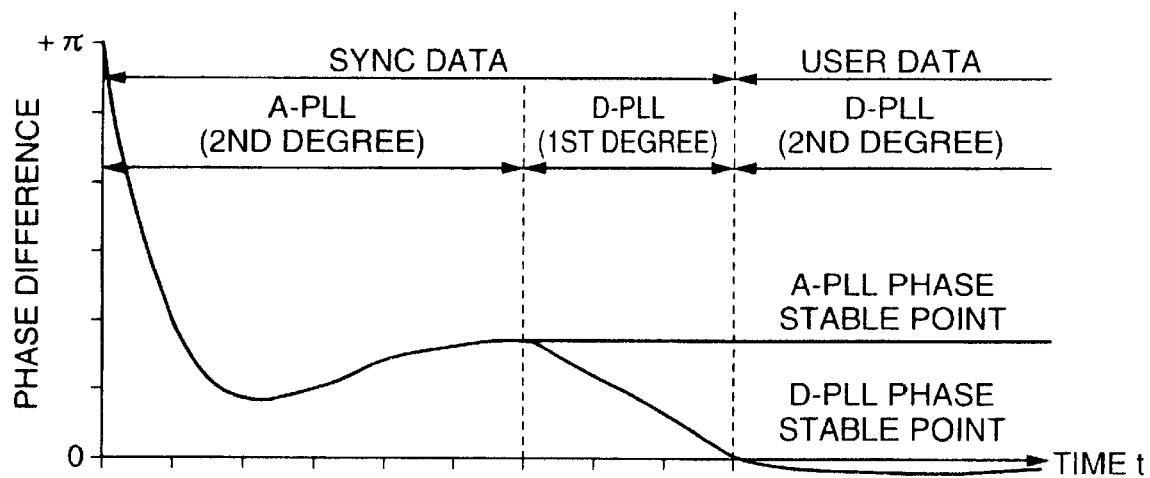
FIG. 22 is a graph for explaining phase capture timing when sync data of FIG. 17(c) is used.
Figure 23:
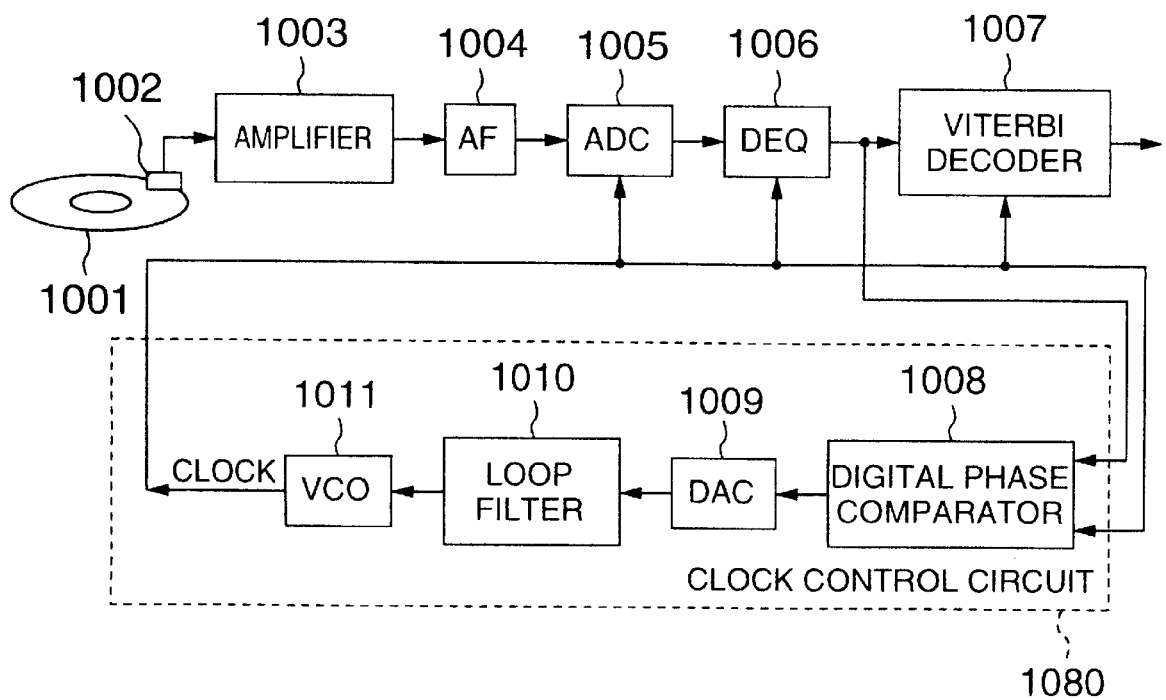
FIG. 23 is a block configuration diagram of the reproducing system of the magnetic disk drive including the conventional clock control circuit.
Figure 24:
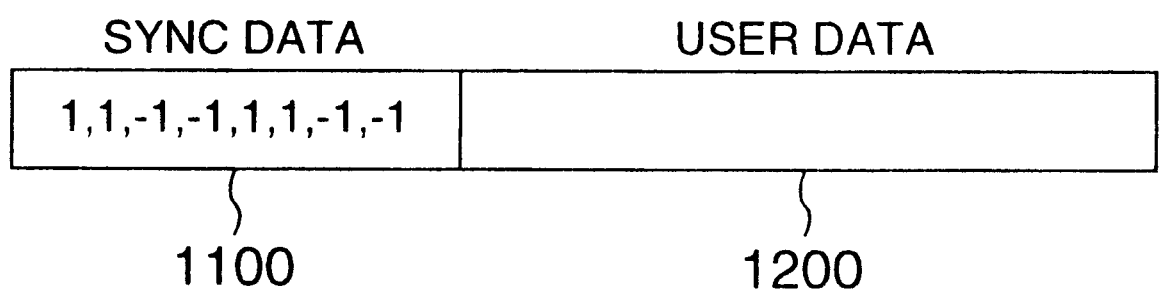
FIG. 24 is a diagram showing the data format of data storing on a magnetic disk in the system of FIG. 23.

The phase locked loops are in general classified into three groups according to the types of loop filters, namely, loops of first degree, loops of second degree, and loops of third or higher degree. The loop of first degree has an advantage of capturing only the phase error at a high speed. Loops of second or higher degree can capture the frequency and phase error, but the speed of capturing the phase error is not satisfactory. Additionally, loops of third or higher degree are associated with difficulty in analysis and hence are rarely used in practices. In the random data region, since the frequency and phase of the reproduction signal are to be captured in the digital PLL, there is employed a loop of second degree. However, in the sync region, since it is only necessary to capture the phase discrepancy, there may be used the loop of first degree as shown in (c) of FIG. 17. FIG. 22 shows the capturing response in the operation above.

Figure 18A:
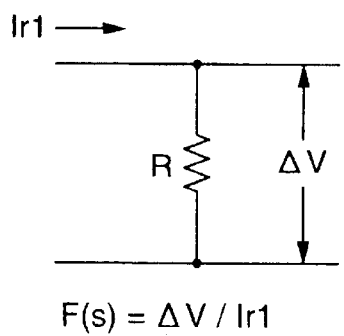
FIGS. 18A and 18B are diagrams respectively showing examples of a first-degree loop filter and a second-degree loop filter.
Figure 18B:
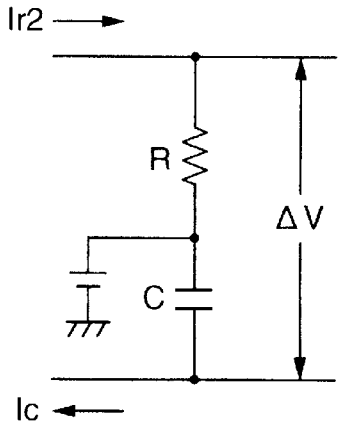

FIGS. 18A and 18B show examples respectively of loop filters of first degree and second degree. In this connection, F(s) stands for a transfer function. The difference therebetween is only presence or absence of a capacitor. Namely, a change-over between these systems can be accomplished only by a switching unit for the connection and disconnection of the capacitor.

Figure 19:
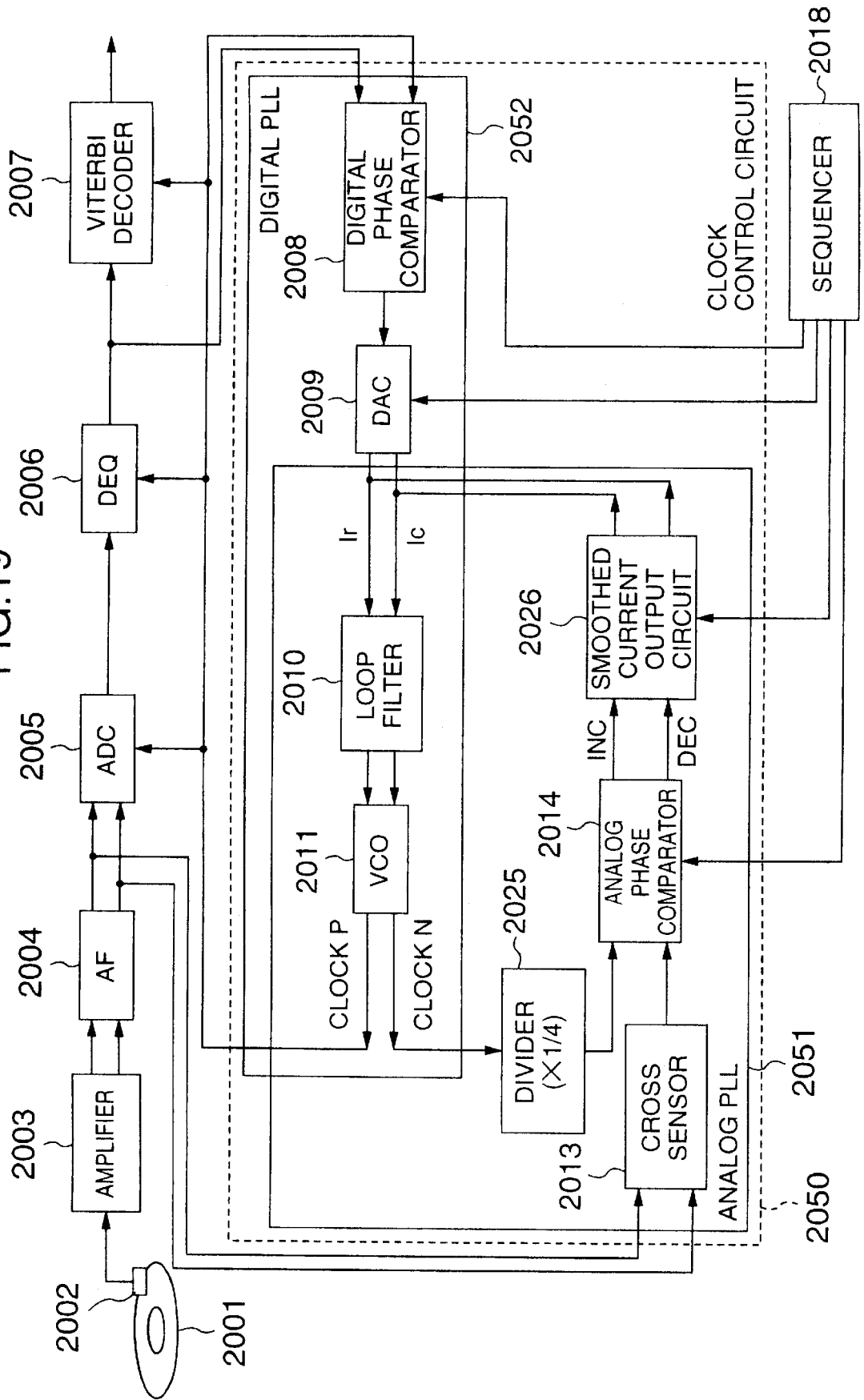
FIG. 19 is a block configuration diagram showing another embodiment of the digital information storage according to the present invention.

FIG. 19 shows an alternative embodiment of the magnetic disk unit according to the present invention.

The clock control circuit 2050 of this diagram is different from the corresponding circuit 2020 of FIG. 15 in that the divider 2023 is replaced with a divider 2025 and the charge pump 2024 is substituted for a smoothed current output circuit 2026. The other constituent components of FIG. 19 are substantially the same as those of FIG. 15 and hence description thereof will be skipped, and only the operation of an analog PLL 2051 will be described.

Figure 20:
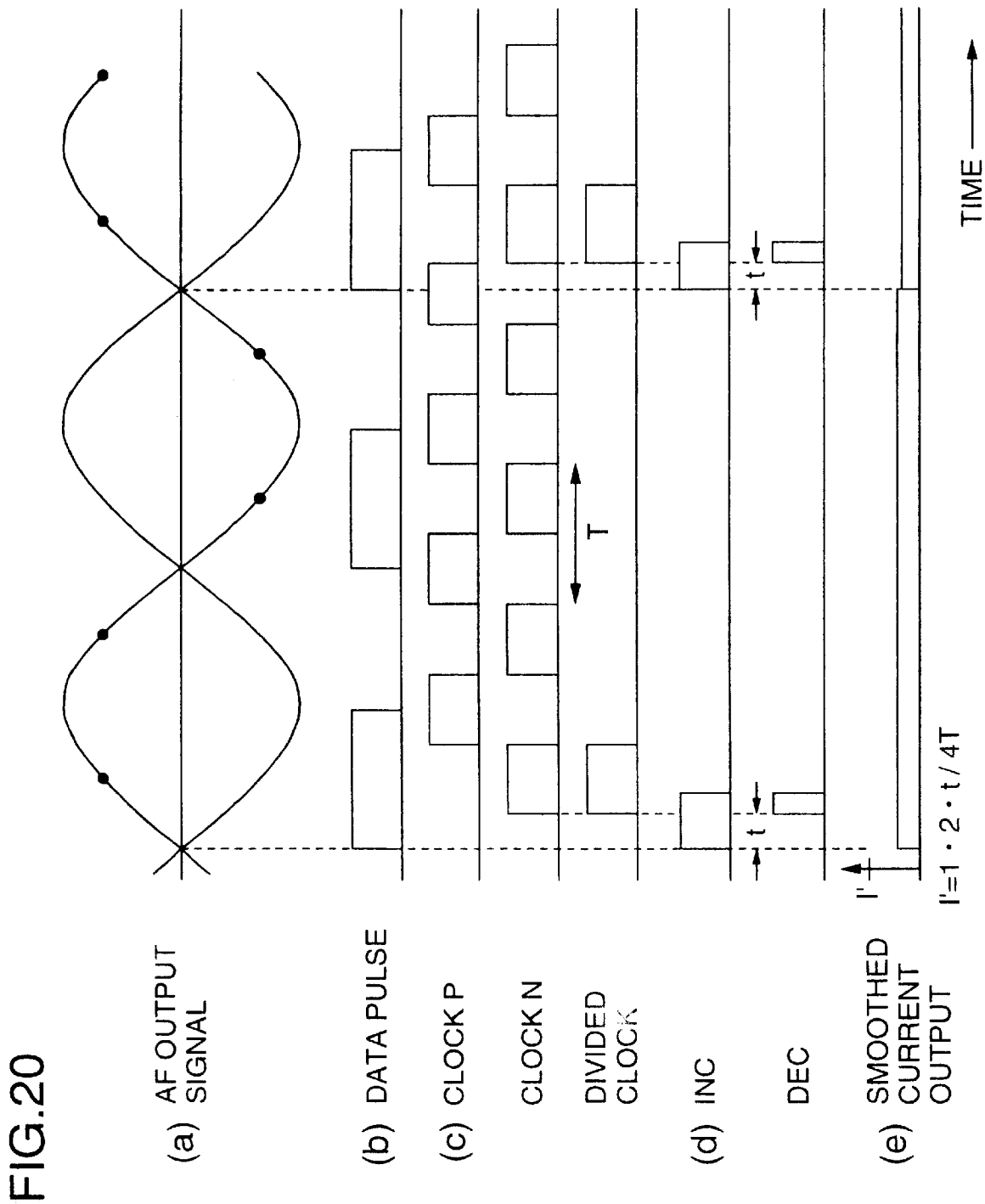
FIG. 20 is a graph for explaining signal waveforms in the operation of the embodiment of FIG. 19.

In the analog PLL, a cross sensor 2013 detects a crosspoint of differential signals of sync data outputted from an active filter 2004 as shown in (a) of FIG. 20 and thereby produces a data pulse of (b) of FIG. 20. The divider 2025 divides the clock signal N by four to produce a divided clock signal shown in (c) of FIG. 20. An analog phase comparator makes a timing comparison between the data pulse signal and the divided clock signal to output therefrom an increment (INC) or decrement (DEC) pulse signal as shown in (d) of FIG. 20. The smoothed current output circuit 2026 continuously supplies an appropriate current I' corresponding to the period of time in which the phase error is being outputted, the current I' being supplied for a period of 4T until the next phase comparison is initiated. The current I' is obtained by dividing by two the signal obtained by dividing the original signal by two. Namely, the current I' is twice the current I of FIG. 16, and the response in the control operation is slightly deteriorated. However, using the smoothed current output circuit 2026, the resultant current is about t/4T times the current I and hence the output current is minimized. Furthermore, the smoothed current output circuit 2026 can be configured in a simplified structure.

In this regard, in the configuration of FIG. 19, a divider which divides an input signal by two may also be adopted in place of the divider 2025 dividing an input signal by four.

Figure 21:
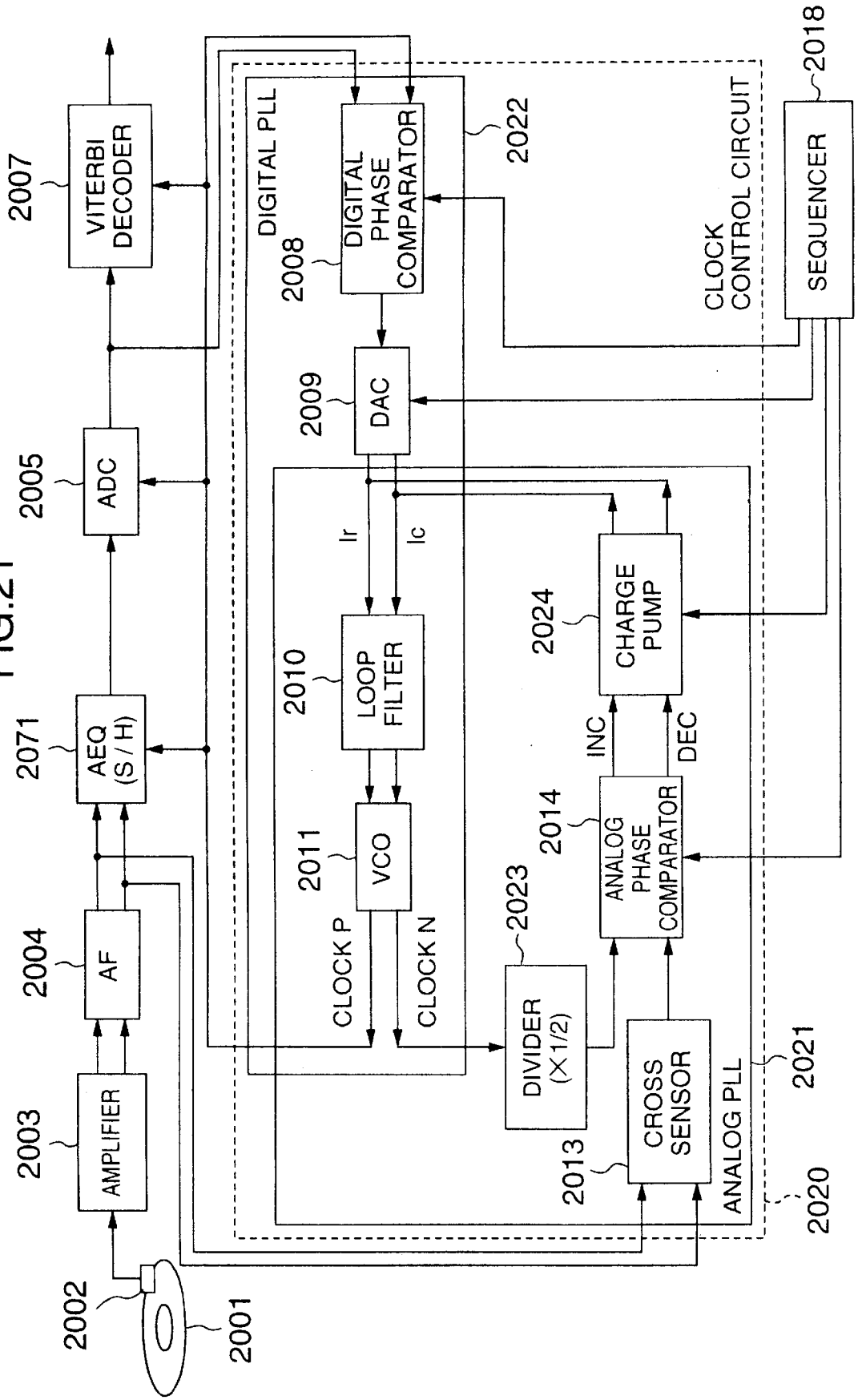
FIG. 21 is a block configuration diagram showing further another embodiment of the digital information storage according to the present invention.

FIG. 21 shows further an alternative embodiment of the magnetic disk drive to which the present invention is applied.

The disk unit of FIG. 21 differs in the configuration from that of FIG. 15 in that the digital equalizer 2006 is replaced with a sample-and-hold analog equalizer 2071 such that a signal from an analog-to-digital converter 2005 disposed next to the analog equalizer 71 is supplied to a digital phase comparator 2008. When compared with the system utilizing a digital equalizer, the system configuration adopting analog equalizer 2071 is attended with a larger operation error, but the power consumption can be minimized. In consequence, this technology is expectedly regarded as suitable for a circuit which processes signals at a low transfer rate. As can be seen from FIG. 21, the present invention can also be simply applied to the construction including an analog equalizer.

According to the clock control circuit described with reference to the embodiments according to the present invention, there is attained an advantage of expansion of the frequency capturing range and minimization of the frequency capturing time. This leads to decrease in the sync data length and hence the user data recording area can be accordingly increased.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A digital information signal reproducing circuit including a clock control circuit including a phase locked loop (PLL) circuit in which a digital information signal received in an analog signal format is sampled according to a clock signal produced from the clock control circuit and is then transformed into a digital information signal of a digital signal format, the clock control circuit including an analog PLL circuit for synchronizing a frequency and a phase of the clock signal with a frequency and a phase of the digital information signal received in the analog signal format, and a digital PLL circuit.

2. A digital information signal reproducing circuit including a clock control circuit including a PLL circuit in which a digital information signal received in an analog signal format is sampled according to a clock signal produced from the clock control circuit and is then transformed into a digital information signal of a digital signal format, the clock control circuit including an analog PLL circuit for synchronizing a frequency and a phase of the clock signal with a frequency and a phase of the digital information signal received in the analog signal format, and a digital PLL circuit, the analog and digital PLL circuits sharing a synchronizing clock generating circuit.

3. A digital information signal reproducing circuit including a clock control circuit including a PLL circuit in which a digital information signal received in an analog signal format is sampled according to a clock signal produced from the clock control circuit and is then transformed into a digital information signal of a digital signal format, the clock control circuit including an analog PLL circuit for synchronizing a frequency and a phase of the clock signal with a frequency and a phase of the digital information signal received in the analog signal format, and a digital PLL circuit, the digital information signal reproducing circuit further including a control circuit for changing over control from the analog PLL circuit to the digital PLL circuit, and vice versa.

4. A digital information signal reproducing circuit including a clock control circuit including a PLL circuit in which a digital information signal received in an analog signal format is sampled according to a clock signal produced from the clock control circuit and is then transformed into a digital information signal of a digital signal format, the clock control circuit including an analog PLL circuit and a digital PLL circuit, the digital information signal reproducing circuit further including a control circuit for changing over control from the analog PLL circuit to the digital PLL circuit, and vice versa, the control circuit first activating, in a digital signal reproduction, the analog PLL circuit and thereafter activating the digital PLL circuit.

5. A digital information signal reproducing circuit according to claim 4, wherein the analog PLL circuit synchronizes a frequency and a phase of the clock signal with a frequency and a phase of the digital information signal received in the analog signal format.

6. A digital information system, comprising:

a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format, each data of the digital information signal from the digital information signal source having a data format including sync data and user data subsequent thereto, the clock control circuit including an analog PLL circuit for synchronizing a frequency and a phase of the clock signal with a frequency and a phase of the digital information signal received from the digital information signal source in the analog signal format, and a digital PLL circuit.

7. A digital information system, comprising:

a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format, each data of the digital information signal from the digital information signal source having a data format including sync data and user data subsequent thereto, the clock control circuit including an analog PLL circuit and a digital PLL circuit, the analog PLL circuit operating when the sync data is reproduced, the digital PLL circuit operating when the user data is reproduced.

8. A digital information system according to claim 7, wherein the analog PLL circuit synchronizes a frequency and a phase of the clock signal with a frequency and a phase of the digital information signal received from the digital information signal source in the analog signal format.

9. A digital information system, comprising:

a digital information signal reproducing circuit including a digital information signal source for supplying a digital information signal in an analog signal format and a clock control circuit including a PLL circuit in which a digital information signal received from the digital information signal source in an analog signal format is sampled according to a clock signal produced from the clock control circuit and is then transformed into a digital information signal of a digital signal format, each data of the digital information signal from the digital information signal source having a data format including sync data and user data subsequent thereto, the clock control circuit including an analog PLL circuit and a digital PLL circuit, the analog PLL circuit operating when the sync data is reproduced, the analog PLL circuit capturing a frequency, the digital PLL circuit operating when the user data is reproduced, the digital PLL circuit capturing and following a frequency and a phase.

10. A digital information system according to claim 9, wherein the analog PLL circuit synchronizes a frequency and a phase of the clock signal with a frequency and a phase of the digital information signal received from the digital information signal source in the analog signal format.

11. A digital information storage, comprising:

a digital information signal reproducing circuit including a storage medium for storing thereon a digital information signal, a read circuit for reading in an analog signal format the digital information signal from the storage medium, and a clock control circuit including a PLL circuit in which a digital information signal received from the read circuit in an analog signal format is sampled according to a clock signal produced from the clock control circuit and is then transformed into a digital information signal of a digital signal format, each data of the digital information signal stored on the storage medium having a data format including sync data and user data subsequent thereto, the clock control circuit including an analog PLL circuit and a digital PLL circuit, the analog PLL circuit operating when the sync data is reproduced, the digital PLL circuit operating when the user data is reproduced.

12. A digital information storage according to claim 11, wherein the analog PLL circuit synchronizes a frequency and a phase of the clock signal with a frequency and a phase of the digital information signal received from the read circuit in the analog signal format.

13. A digital information storage, comprising:

a digital information signal reproducing circuit including a storage medium for storing thereon a digital information signal, a read circuit for reading in an analog signal format the digital information signal from the storage medium, and a clock control circuit including a PLL circuit in which a digital information signal received from the read circuit in an analog signal format is sampled according to a clock signal produced from the clock control circuit and is then transformed into a digital information signal of a digital signal format, each data of the digital information signal stored on the storage medium having a data format including sync data and user data subsequent thereto, the clock control circuit including an analog PLL circuit and a digital PLL circuit, the analog PLL circuit operating when the sync data is reproduced, the analog PLL circuit capturing a frequency, the digital PLL circuit operating when the user data is reproduced, the digital PLL circuit capturing and following a frequency and a phase.

14. A digital information storage according to claim 13, wherein the analog PLL circuit synchronizes a frequency and a phase of the clock signal with a frequency and a phase of the digital information signal received from the read circuit in the analog signal format.

15. A digital information storage, comprising:

a digital information signal reproducing circuit including a storage medium for storing thereon a digital information signal, a read circuit for reading in an analog signal format the digital information signal from the storage medium, and a clock control circuit including a PLL circuit in which a digital information signal received from the read circuit in an analog signal format is sampled according to a clock signal produced from the clock control circuit and is then transformed into a digital information signal of a digital signal format, each data of the digital information signal stored on the storage medium having a data format including sync data and user data subsequent thereto, the clock control circuit including an analog PLL circuit and a digital PLL circuit, the analog PLL circuit operating when the sync data is reproduced, the digital PLL circuit operating when the user data is reproduced, the sync data including at most 12 bytes.

16. A digital information storage according to claim 15, wherein the analog PLL circuit synchronizes a frequency and a phase of the clock signal with a frequency and a phase of the digital information signal received from the read circuit in the analog signal format.

17. A digital information signal reproducing circuit, comprising:

an analog-to-digital converter for converting a digital information signal in a differential analog format into a digital information signal in a digital signal format;

an equalizer for achieving a waveform equalization; and a clock control circuit for controlling a frequency and a phase of a clock signal to match a frequency and a phase of the digital information signal in the differential analog format, the clock control circuit including:

first detecting means for detecting a phase error between the digital information signal in the differential analog format before a sampling operation thereof and the clock signal;

second detecting means for detecting a phase error between a reproduction signal attained by achieving a waveform equalization (for the digital information signal) through the equalizer and the clock signal;

a loop filter for removing a high-frequency component from a signal inputted thereto;

a voltage controlled oscillator having a clock signal oscillation frequency controlled by a signal outputted from the loop filter; and a sequencer for controlling operations of the first and second detecting means.

18. A digital information signal reproducing circuit according to claim 17, wherein the first detecting means includes:

a cross sensor for outputting therefrom a pulse signal at timing of intersection of the digital information signal in the differential analog format before the sampling thereof;

a divider for dividing the clock signal outputted from the voltage controlled oscillator;

a phase comparator for detecting a phase error between the signal outputted from the divider and the pulse signal outputted from the cross sensor; and a current outputting circuit for supplying a current corresponding to the signal outputted from the phase comparator.

19. A digital information signal reproducing circuit according to claim 17, wherein the second detecting means includes:

a phase comparator for detecting as a phase error a gradient of amplitude values at two adjacent points of the reproduction signal undergone the sampling operation and the waveform equalization; and a digital-to-analog converter for converting the gradient detected as the phase error by the phase comparator into an amount of current corresponding to the gradient.

20. A digital information signal reproducing circuit according to claim 18, wherein the second detecting means includes:

a phase comparator for detecting as a phase error a gradient of amplitude values at two adjacent points of the reproduction signal undergone the sampling operation and the waveform equalization; and a digital-to-analog converter for converting the gradient detected as the phase error by the phase comparator into an amount of current corresponding to the gradient.

21. A digital information signal reproducing circuit according to claim 18, wherein the current output circuit includes a charge pump for producing a current pulse signal having a pulse width corresponding to the signal outputted from the phase comparator.

22. A digital information signal reproducing circuit according to claim 18, wherein the current output circuit includes a smoothed current output circuit for continuously supplying a smoothed current for a period of a divided clock signal, the current having a current value corresponding to the signal outputted from the phase comparator.

23. A digital information signal reproducing circuit according to claim 17, wherein the clock signal inputted to the first detecting means and the clock signal inputted to the second detecting means, the analog-to-digital converter, and the equalizer have a phase discrepancy of $\pi$ therebetween.

24. A digital information signal reproducing circuit according to claim 19, wherein the clock signal inputted to the first detecting means and the clock signal inputted to the second detecting means, the analog-to-digital converter, and the equalizer have a phase discrepancy of $\pi$ therebetween.

25. A digital information signal reproducing circuit according to claim 17, wherein the loop filter is of second or higher degree and is connected to the first detecting means and the second detecting means.

26. A digital information system, comprising:

a digital information signal reproducing circuit including a digital information signal source for supplying a digital information signal in an analog signal format and a clock control circuit including a PLL circuit in which a digital information signal received from the digital information signal source in a differential analog signal format is sampled according to a clock signal produced from the clock control circuit and is then transformed into a digital information signal of a digital signal format, each data of the digital information signal from the digital information signal source having a data format including sync data and user data subsequent thereto, the clock control circuit including:

first detecting means for detecting a phase error between the digital information signal in the differential analog format before a sampling operation thereof and the clock signal;

second detecting means for detecting a phase error between a reproduction signal attained by achieving a waveform equalization (for the digital information signal) through an equalizer and the clock signal;

a loop filter for removing a high-frequency component from a signal inputted thereto;

a voltage controlled oscillator having a clock signal oscillation frequency controlled by a signal outputted from the loop filter; and a sequencer for controlling operations of the first and second detecting means.

27. A digital information system according to claim 26, wherein the loop filter is of second or higher degree and is connected to the first detecting means and the second detecting means.

28. A digital information storage, comprising:

a digital information signal reproducing circuit including a storage medium for storing thereon a digital information signal, a read circuit for reading in a differential analog signal format the digital information signal from the storage medium, and a clock control circuit including a PLL circuit in which a digital information signal received from the read circuit in an analog signal format is sampled according to a clock signal produced from the clock control circuit and is then transformed into a digital information signal of a digital signal format, each data of the digital information signal stored on the storage medium having a data format including sync data and user data subsequent thereto, the clock control circuit including:

first detecting means for detecting a phase error between the digital information signal in the differential analog format before a sampling operation thereof and the clock signal;

second detecting means for detecting a phase error between a reproduction signal attained by achieving a waveform equalization (for the digital information signal) through an equalizer and the clock signal;

a loop filter for removing a high-frequency component from a signal inputted thereto;

a voltage controlled oscillator having a clock signal oscillation frequency controlled by a signal outputted from the loop filter; and a sequencer for controlling operations of the first and second detecting means.

29. A digital information storage according to claim 28, wherein the loop filter is of second or higher degree and is connected to the first detecting means and the second detecting means.

30. A clock control method of controlling a clock signal in a digital information signal reproducing circuit in which a digital information signal received in an analog signal format is sampled according to the clock signal and is then transformed into a digital information signal in a digital format, the received digital information signal including a sync data field and a user data field subsequent thereto, comprising the steps of:

synchronizing in the sync data field the clock signal with the received digital information signal by an analog PLL circuit; and synchronizing in the user data field the clock signal with the received digital information signal by a digital PLL circuit.

31. A clock control method according to claim 30, wherein the step of synchronizing in the sync data field the clock signal with the received digital information signal by an analog PLL circuit includes the step of synchronizing in the sync data field a frequency and a phase of the clock signal with a frequency and a phase of the received digital information signal by the analog PLL circuit.

32. A clock control method of controlling a clock signal in a digital information signal reproducing circuit in which a digital information signal received in an analog signal format is sampled according to the clock signal and is then transformed into a digital information signal in a digital format, the received digital information signal including a sync data field and a user data field subsequent thereto, comprising the steps of:

synchronizing in the sync data field the clock signal with the received digital information signal by an analog PLL circuit;

synchronizing in the user data field the clock signal with the received digital information signal by a digital PLL circuit;

initiating the clock synchronization by the analog PLL circuit beginning at a starting point of the sync data field; and initiating the clock synchronization by the digital PLL circuit beginning at an intermediate point of the sync data field.

33. A clock control method according to claim 32, wherein the digital PLL circuit employed in the sync and user data fields is a digital PLL including a second-degree loop.

34. A clock control method according to claim 32, wherein the digital PLL circuit employed in the sync field is a digital PLL including a first-degree loop and the digital PLL circuit employed in the user data fields is a digital PLL including a second-degree loop.

35. A clock control method according to claim 32, wherein the analog PLL circuit is a digital PLL including a second-degree loop.

36. A clock control method according to claim 32, wherein the step of synchronizing in the sync data field the clock signal with the received digital information signal by an analog PLL circuit includes the step of synchronizing in the sync data field a frequency and a phase of the clock signal with a frequency and a phase of the received digital information signal by the analog PLL circuit.

37. A clock control method of controlling a clock signal in a digital information signal reproducing circuit in which a digital information signal recorded on a storage medium is read therefrom in an analog signal format, the digital information signal including a sync data field and a user data field subsequent thereto, and the digital information signal is sampled according to the clock signal and is then transformed into a digital information signal in a digital format, comprising the steps of:

synchronizing in the sync data field the clock signal with the received digital information signal by an analog PLL circuit; and synchronizing in the user data field the clock signal with the received digital information signal by a digital PLL circuit.

38. A clock control method according to claim 37, further including the steps of:

initiating the clock synchronization by the analog PLL circuit beginning at a starting point of the sync data field; and initiating the clock synchronization by the digital PLL circuit beginning at an intermediate point of the sync data field.

39. A clock control method according to claim 38, wherein the digital PLL circuit employed in the sync and user data fields is a digital PLL including a second-degree loop.

40. A clock control method according to claim 38, wherein the digital PLL circuit employed in the sync field is a digital PLL including a first-degree loop and the digital PLL circuit employed in the user data fields is a digital PLL including a second-degree loop.

41. A clock control method according to claim 38, wherein the analog PLL circuit is a digital PLL including a second-degree loop.

42. A clock control method according to claim 37, wherein the step of synchronizing in the sync data field the clock signal with the received digital information signal by an analog PLL circuit includes the step of synchronizing in the sync data field a frequency and a phase of the clock signal with a frequency and a phase of the received digital information signal by the analog PLL circuit.

* * * * *